United States Patent
Kubota et al.

(10) Patent No.: US 10,090,110 B2
(45) Date of Patent: *Oct. 2, 2018

(54) CRYSTAL UNIT AND METHOD OF ADJUSTING CRYSTAL UNIT

(71) Applicant: FUJITSU LIMITED, Kawasaki-shi, Kanagawa (JP)

(72) Inventors: Hajime Kubota, Kawasaki (JP); Masayuki Itoh, Kawasaki (JP); Masakazu Kishi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 109 days.

This patent is subject to a terminal disclaimer.

(21) Appl. No.: 15/281,193

(22) Filed: Sep. 30, 2016

(65) Prior Publication Data

US 2017/0098507 A1 Apr. 6, 2017

(30) Foreign Application Priority Data

Oct. 6, 2015 (JP) .................................. 2015-198887

(51) Int. Cl.
*H01G 4/40* (2006.01)
*H01G 4/30* (2006.01)
*H01L 41/04* (2006.01)

(52) U.S. Cl.
CPC ................. *H01G 4/40* (2013.01); *H01G 4/30* (2013.01); *H01L 41/042* (2013.01)

(58) Field of Classification Search
CPC ................................... H01G 4/30; H01G 4/40
See application file for complete search history.

(56) References Cited

U.S. PATENT DOCUMENTS

| | | | | |
|---|---|---|---|---|
| 4,574,255 A | * | 3/1986 | Fujii | C04B 35/497 257/E23.009 |
| 2009/0154121 A1 | * | 6/2009 | Lee | H05K 1/0243 361/761 |
| 2014/0133064 A1 | * | 5/2014 | Ahn | H01G 4/30 361/303 |
| 2017/0099039 A1 | * | 4/2017 | Kubota | H03H 3/02 |

FOREIGN PATENT DOCUMENTS

| | | |
|---|---|---|
| JP | 04-211505 | 8/1992 |
| JP | 09-298439 | 11/1997 |
| JP | 2003-158440 A | 5/2003 |

* cited by examiner

*Primary Examiner* — Jeffrey Shin
(74) *Attorney, Agent, or Firm* — Fujitsu Patent Center

(57) ABSTRACT

A crystal unit includes: a capacitor in which a plurality of dielectrics and a plurality of internal electrodes are alternately stacked; a crystal piece arranged above the capacitor and having excitation electrodes on both surfaces thereof; an external electrode formed on a surface of the capacitor; and a first conductor portion formed within the capacitor, and including one end electrically coupled to a first internal electrode among the plurality of internal electrodes, the other end electrically coupled to the external electrode, and a first exposed portion exposed on the surface of the capacitor between the one end and the other end.

16 Claims, 20 Drawing Sheets

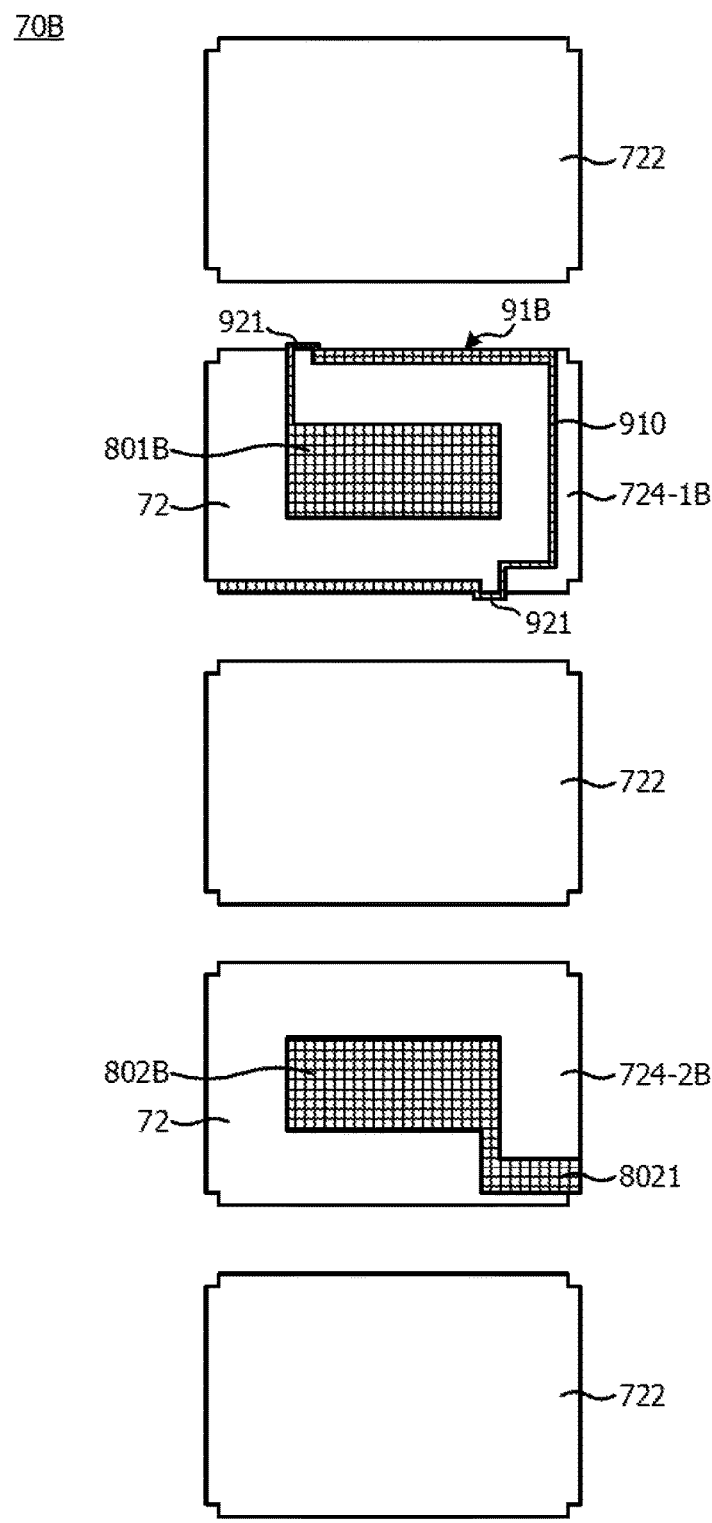

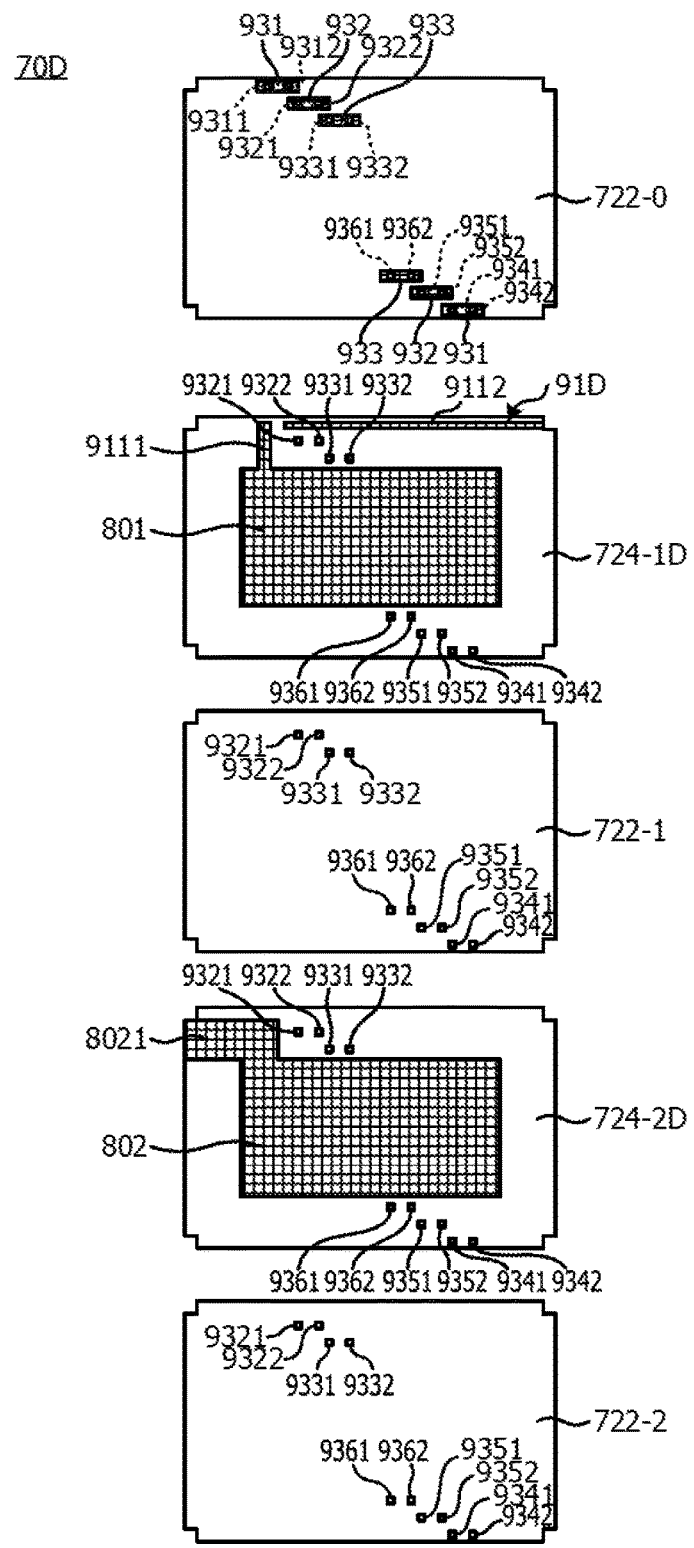

CRYSTAL UNIT AND METHOD OF ADJUSTING CRYSTAL UNIT

CROSS-REFERENCE TO RELATED APPLICATIONS

This application is based upon and claims the benefit of priority of the prior Japanese Patent Application No. 2015-198887 filed on Oct. 6, 2015, the entire contents of which are incorporated herein by reference.

FIELD

The embodiments discussed herein are related to a crystal unit, and a method of adjusting the crystal unit.

BACKGROUND

There is known a technology of finely adjusting an oscillation frequency of a surface mounting type piezoelectric component by reducing a part of an input electrode pattern, an earth electrode pattern, or an output electrode pattern through laser trimming during the manufacturing process of the piezoelectric component.

In the related art, a capacitance may be adjusted by cutting a part of an output electrode pattern at the time of manufacturing the piezoelectric component, but may not be adjusted after the piezoelectric component is mounted on a board. When the piezoelectric component is mounted on the board and electrically coupled to an integrated circuit (IC), a vibration characteristic is varied under the influence of the capacitance of the pattern or the like on the board. Thus, it is difficult to obtain a desired vibration characteristic even when the capacitance is adjusted during the manufacturing.

The following is a reference document.
[Document 1] Japanese Laid-Open Patent Publication No. 09-298439.

SUMMARY

According to an aspect of the invention, a crystal unit includes: a capacitor in which a plurality of dielectrics and a plurality of internal electrodes are alternately stacked; a crystal piece arranged above the capacitor and having excitation electrodes on both surfaces thereof; an external electrode formed on a surface of the capacitor; and a first conductor portion formed within the capacitor, and including one end electrically coupled to a first internal electrode among the plurality of internal electrodes, the other end electrically coupled to the external electrode, and a first exposed portion exposed on the surface of the capacitor between the one end and the other end.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7A is an explanatory view of a stacked structure of a capacitor body according to a second embodiment (Part 1);

FIG. 11A is an explanatory view of a stacked structure of a capacitor body according to a fourth embodiment (Part 1);

DESCRIPTION OF EMBODIMENTS

Hereinafter, detailed descriptions will be made on respective embodiments with reference to accompanying drawings.

In the following description, unless otherwise specified, the terms "connection" and "disconnection" refer to "electrical connection" and "electrical disconnection," respectively. In the following description, the term "internal electrode" represents a conductor region formed in the inner layer of a capacitor body, that is, a conductor region that may function as a capacitor. That is, such a conductor region may not function as a capacitor as described below after the capacitance is adjusted. However, in this case as well, the conductor region is an "internal electrode."

Figure 1:
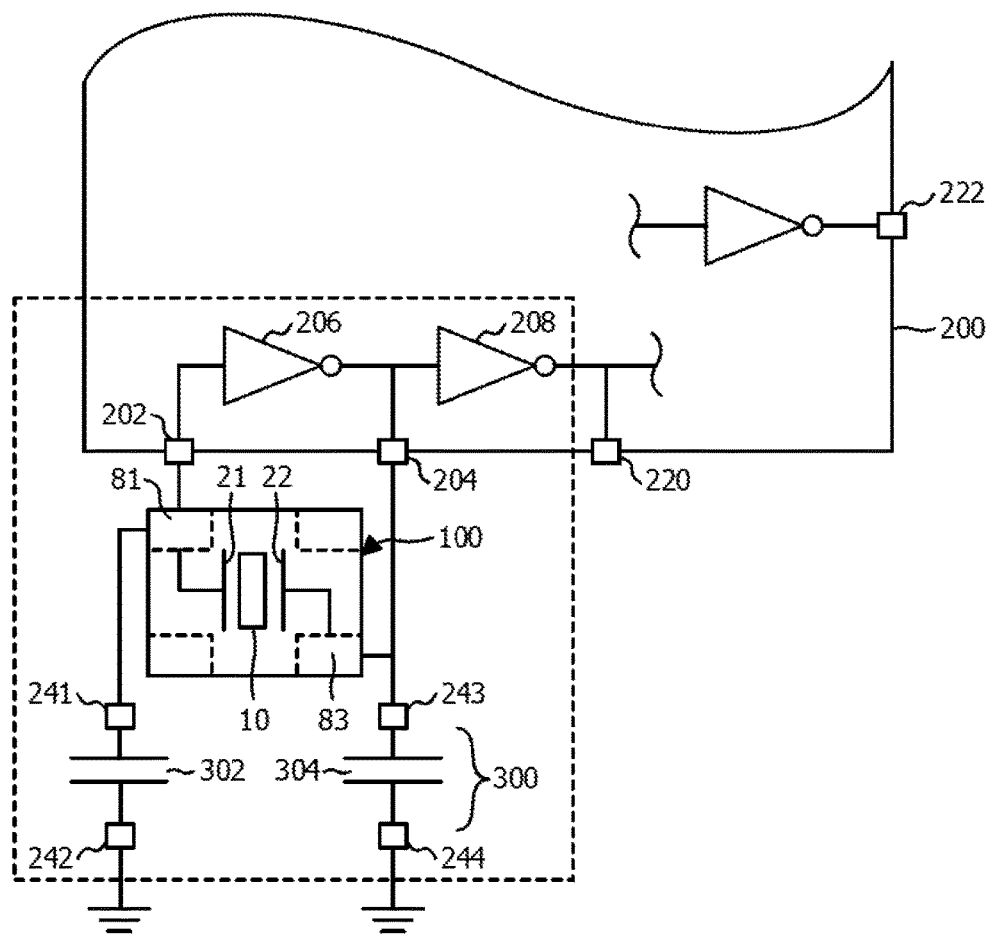
FIG. 1 is a diagram schematically illustrating an example of a circuit configuration incorporating a crystal unit.

FIG. 1 is a diagram schematically illustrating an example of a circuit configuration incorporating a crystal unit 100.

In the example illustrated in FIG. 1, the crystal unit 100 is connected to an IC 200. That is, electrodes 81 and 83 of the crystal unit 100 are connected to an input terminal 202 and an output terminal 204 of the IC 200, respectively. The crystal unit 100 generates a clock to be used in the IC 200. The IC 200 includes an inverting amplifier 206 and an output buffer 208. The signal input to the input terminal 202 from an upper excitation electrode 21 via the electrode 81 is inversely amplified by the inverting amplifier 206. The inversely amplified signal is input to the output buffer 208, and is supplied to a lower excitation electrode 22 via the electrode 83. In the example illustrated in FIG. 1, the arrangement of the upper excitation electrode 21 and the lower excitation electrode 22 may be reversed.

A matching capacitor 300 is connected to the crystal unit 100. Specifically, a first capacitor 302 is connected between the ground and the electrode 81 of the crystal unit 100, and a second capacitor 304 is connected between the ground and the electrode 83 of the crystal unit 100. Here, the first capacitor 302 is connected to the electrode 81 through a first electrode 241 and is connected to the ground through a second electrode 242. Similarly, the second capacitor 304 is connected to the electrode 83 through a third electrode 243 and is connected to the ground through a fourth electrode 244. In FIG. 1, with respect to the IC 200, a capacitance inside the terminal, a stray capacitance of a wiring pattern of a mounting board, a resistance that limits the current flowing through the crystal unit 100 and the like are not illustrated. The matching capacitor 300 is provided to perform adjustment (matching adjustment) so that the oscillation frequency of the crystal unit 100 becomes a desired value (a design value) when the total capacity (the load capacity value) of all of the crystal unit 100 and the circuit of the IC 200 is set as a load. In FIG. 1, the area surrounded by dotted lines forms an oscillation circuit.

Hereinafter, descriptions will be made on several embodiments of a crystal unit applicable as the crystal unit 100 illustrated in FIG. 1.

First Embodiment

Figure 2:
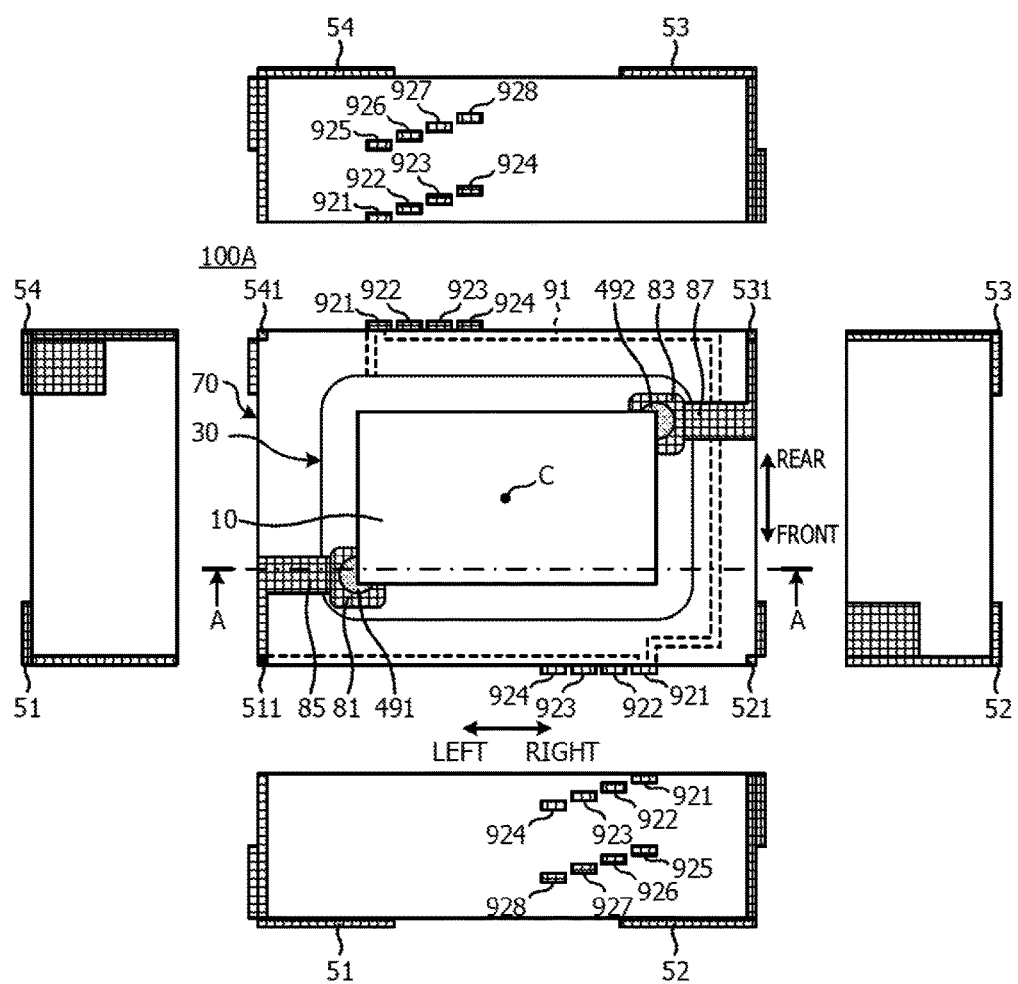
FIG. 2 is a 5-sided view of the crystal unit according to a first embodiment.
Figure 3:
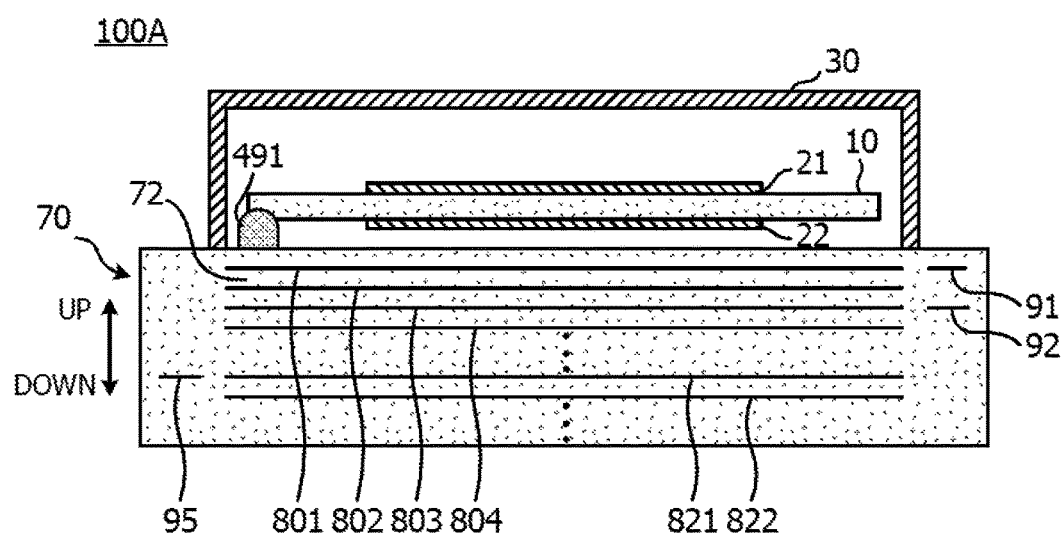
FIG. 3 is a sectional view taken along the line A-A of FIG. 2.

FIG. 2 is a 5-sided view of a crystal unit 100A according to a first embodiment. In the top view of FIG. 2, the configuration (e.g., a crystal piece 10 or the like) within a casing 30 is illustrated in perspective view. In FIG. 2, only a conductor portion 91 among conductor portions 91 to 95 is illustrated in perspective view. FIG. 3 is a sectional view taken along the line A-A of FIG. 2. In FIG. 3, only a part of a plurality of internal electrodes is illustrated.

Hereinafter, the thickness direction of the crystal piece 10 (e.g., the vertical direction in FIG. 3) is set as a vertical direction, and a side of the casing 30 with respect to the capacitor body 70 is set as an "upper" side. Further, the front-rear direction, and the left-right direction are the same as those illustrated in FIG. 2. However, the direction of the mounting state of the crystal unit 100A is optional.

The crystal unit 100A includes the crystal piece 10, the casing 30, the electrodes 81 and 83, external electrodes 51 to 54, the capacitor body 70, and the conductor portions 91 to 95 (e.g., an example of a first conductor portion or a second conductor portion). In the example illustrated in FIG. 2, the crystal unit 100A has a configuration symmetrical with respect to a point of the center C. Also, the crystal unit 100A further includes the upper excitation electrode 21 and the lower excitation electrode 22 as illustrated in FIG. 1, but the illustration of the upper excitation electrode 21 and the lower excitation electrode 22 is omitted in FIGS. 2 and 3.

The crystal piece 10 may be, for example, an AT-cut synthetic crystal substrate. The crystal piece 10 is supported by the capacitor body 70 through conductive adhesives 491 and 492. Here, the upper excitation electrode 21 is connected to the electrode 81 through the conductive adhesive 491, and the lower excitation electrode 22 is connected to the electrode 83 through the conductive adhesive 492.

The casing 30 is formed of, for example, metal. The casing 30 has a configuration having an interior space in which only the lower side is opened. The casing 30 is provided on the capacitor body 70 in such a manner that the casing 30 includes the crystal piece 10 in the internal space, and the lower side opening is sealed by the top surface of the capacitor body 70. For example, the interior space of the casing 30 may be kept in a vacuum or may be filled with dry nitrogen.

The electrodes 81 and 83 are formed on the top surface of the capacitor body 70. The electrode 81 is connected to the external electrode 51 (see, e.g., FIG. 2) via a conductor pattern 85 formed on the top surface of the capacitor body 70. In the example illustrated in FIG. 2, the electrode 81 and the conductor pattern 85 are formed at a position close to the external electrode 51, that is, at the front left side on the top surface of the capacitor body 70. The electrode 83 is connected to the external electrode 53 (see, e.g., FIG. 2) via a conductor pattern 87 formed on the top surface of the capacitor body 70. The electrode 83 and the conductor pattern 87 are formed at a position close to the external electrode 53, that is, at the rear right side of the top surface of the capacitor body 70. Also, the conductor pattern 85 and the conductor pattern 87 may be formed in the inner layer of the capacitor body 70.

The external electrodes 51 to 54 are provided on the surface of the capacitor body 70. The external electrodes 51 to 54 form the first electrode 241, the second electrode 242, the third electrode 243 and the fourth electrode 244 illustrated in FIG. 1, respectively.

In the example illustrated in FIG. 2, the external electrodes 51 to 54, respectively, are formed on the bottom surface of the capacitor body 70. Specifically, the external electrode 51 is formed on the front left side of the bottom surface of the capacitor body 70, and the external electrode 52 is formed on the front right side of the bottom surface of the capacitor body 70. The external electrode 53 is formed on the rear right side of the bottom surface of the capacitor body 70, and the external electrode 54 is formed on the rear left side of the bottom surface of the capacitor body 70. On corner portions of side surfaces of the capacitor body 70, conductor portions 511 to 541 extend in the vertical direction to connect to the external electrodes 51 to 54 respectively.

The capacitor body 70 forms the matching capacitor 300 (see, e.g., FIG. 1) of the crystal unit 100A. The capacitor body 70 has a stacked structure including a dielectric 72 and internal electrodes (e.g., internal electrodes 801 to 804, 821, and 822). The dielectric 72 includes, for example, a ceramic material. The dielectric 72 is formed, for example, between the respective internal electrodes (e.g., the internal electrodes 801 to 804, 821, and 822) in the vertical direction. The dielectric 72 forms the surface layer of the capacitor body 70. In FIG. 3, reference numeral "72" indicates a portion between two certain upper and lower internal electrodes 801 and 802.

In the example illustrated in FIG. 3, a plurality of internal electrodes 801 to 804, and the portion of the dielectric 72 between the internal electrodes form the first capacitor 302. That is, the internal electrodes 801 and 802 are paired, and the internal electrodes 803 and 804 are paired so that a total of two capacitors are formed. The two capacitors are parallel to each other to form the first capacitor 302. Similarly, a plurality of internal electrodes 821 and 822, and the portion of the dielectric 72 between the internal electrodes form the second capacitor 304. That is, the internal electrodes 821 and 822 are paired so as to form a capacitor. This capacitor and another similar capacitor (not illustrated) are parallel to each other to form the second capacitor 304. However, as described later, some of the plurality of internal electrodes (e.g., internal electrodes 801 to 804, 821, and 822) may be disconnected from the ground. In this case, a pair of internal electrodes including an internal electrode disconnected from the ground does not form the first capacitor 302 or the second capacitor 304. The number or arrangement of the internal electrodes is not limited to that illustrated in FIG. 3, but is optional.

The conductor portions 91 to 95 are formed in the inner layer of the capacitor body 70. However, exposed portions 921 to 928 to be described later (e.g., an example of a first or second exposed portion) may be formed on the surface of the capacitor body 70. In FIG. 2, only the conductor portion 91 is illustrated. The conductor portions 91 to 94 (the same applies to the conductor portion 95) are formed in layers in which corresponding internal electrodes are formed (different layers from each other). For example, the conductor portion 91 is formed in a layer in which the internal electrode 801 is formed, and the conductor portion 92 is formed in a layer in which the internal electrode 803 is formed. The conductor portion 95 is illustrated in FIG. 3. The conductor portion 95 is formed point-symmetrically around the center C with respect to the conductor portion 91. The conductor portion 95 is formed in a layer in which the internal electrode 821 is formed.

Figure 4A:
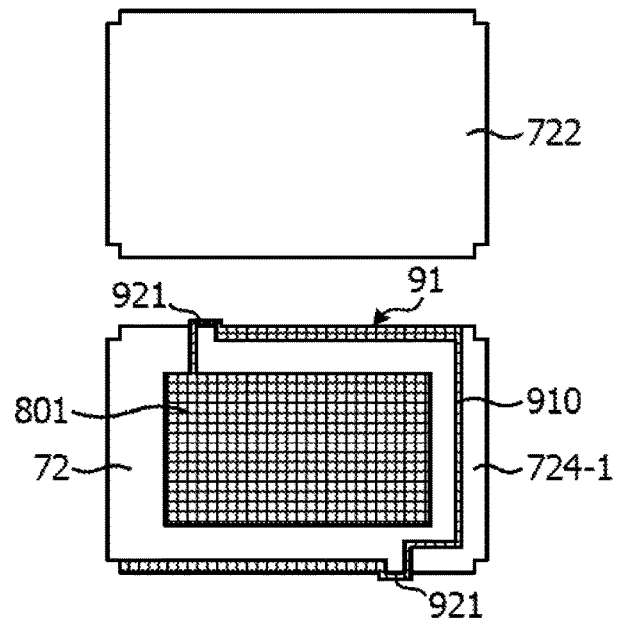
FIG. 4A is an explanatory view of a stacked structure of a capacitor body according to the first embodiment (Part 1)
Figure 4A:
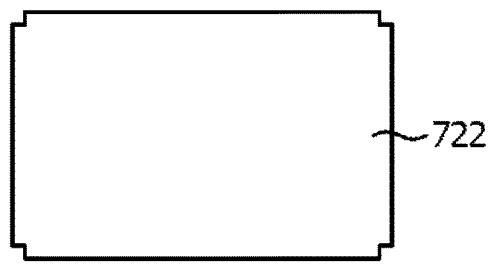
Figure 4A:
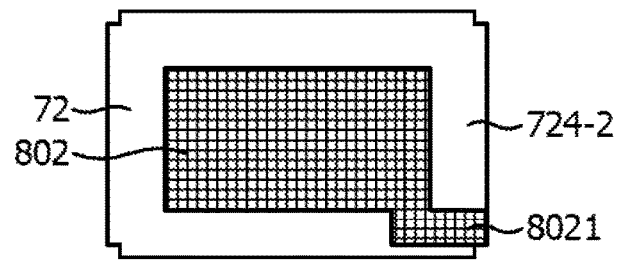
Figure 4A:
Figure 4B:
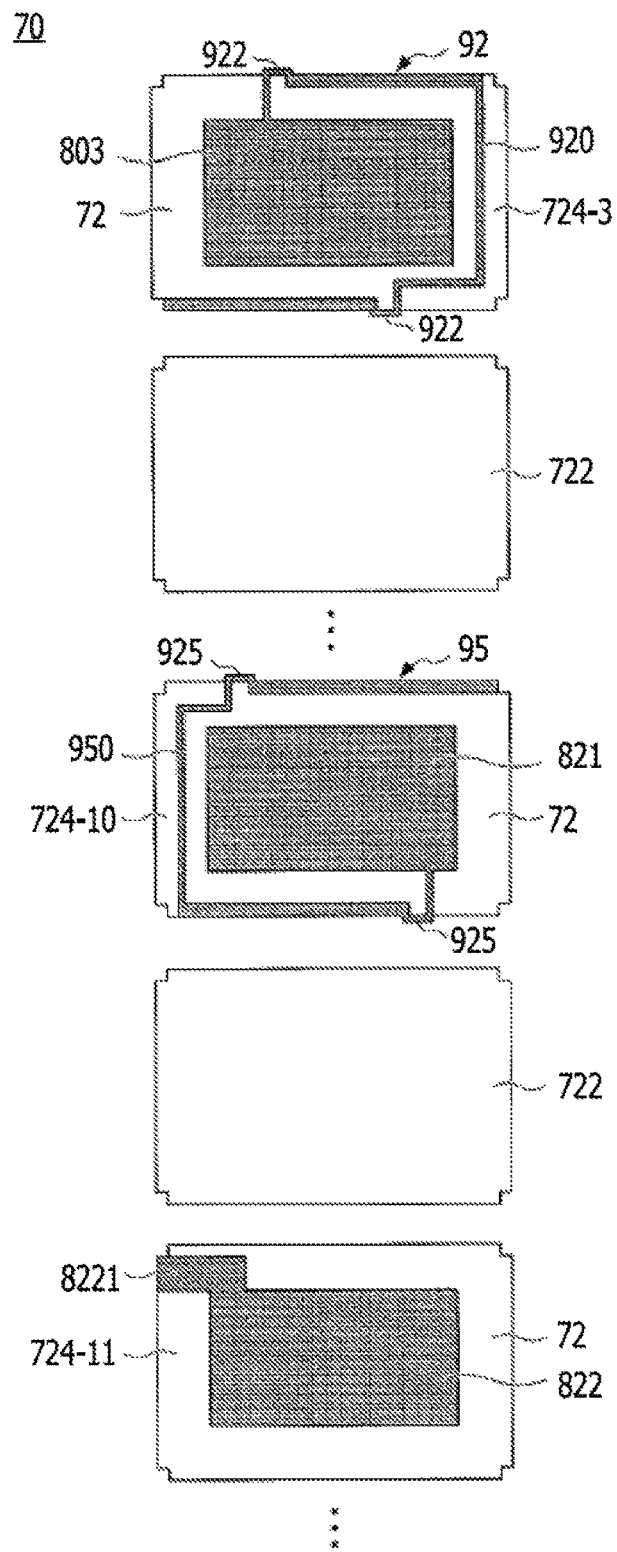
FIG. 4B is an explanatory view of a stacked structure of the capacitor body according to the first embodiment (Part 2)

FIGS. 4A and 4B are explanatory views of a stacked structure of the capacitor body 70, and illustrate top views of respective layers of the capacitor body 70. In FIGS. 4A and 4B, among the conductor portions 91 to 95, only the conductor portions 91, 92 and 95 are illustrated.

The capacitor body 70, as illustrated in FIGS. 4A and 4B, has a stacked structure in which a dielectric layer 722 formed by the dielectric 72 and an internal electrode layer formed with the internal electrode are alternately stacked. The internal electrode layers, as illustrated in FIGS. 4A and 4B, include internal electrode layers 724-1 to 724-11. In the internal electrode layer 724-1, the internal electrode 801 and the conductor portion 91 are formed, and in the internal electrode layer 724-2, the internal electrode 802 is formed. The dielectric layer 722 is sandwiched between the internal electrode layers 724-1 and 724-2. The internal electrode 802 is connected to the external electrode 52 via a conductor pattern 8021. For example, the internal electrode 801 and the conductor portion 91 may be formed by printing a conductor on the dielectric layer. Similarly, the internal electrode 802 and the conductor pattern 8021 may be formed by printing a conductor on the dielectric layer. In the same manner, the capacitor related to the internal electrodes 803 and 804 is formed. Further, in the internal electrode layer 724-10, the internal electrode 821 and the conductor portion 95 are formed, and in the internal electrode layer 724-11, the internal electrode 822 is formed. The dielectric layer 722 is sandwiched between the internal electrode layers 724-11 and 724-10. The internal electrode 822 is connected to the external electrode 54 via a conductor pattern 8221. For example, the internal electrode 821 and the conductor portion 95 may be formed by printing a conductor on the dielectric layer. Similarly, the internal electrode 822 and the conductor pattern 8221 may be formed by printing a conductor on the dielectric layer.

The conductor portion 91, as illustrated in FIG. 4A, includes the body portion 910 and the exposed portion 921. The body portion 910 has one end connected to the internal electrode 801 and the other end connected to the external electrode 51. In the example illustrated in FIG. 4A, the body portion 910 is connected to the external electrode 51 through the conductor portion 511 (not illustrated in FIG. 4A). The body portion 910 extends to surround three sides of the internal electrode 801 in the left-right direction at the rear side of the internal electrode 801, in the front-rear direction at the right side of the internal electrode 801, and in the left-right direction at the front side of the internal electrode 801. The body portion 910 may be formed while not exposed to the surface (the side surface) of the capacitor body 70. In the body portion 910, breaks (discontinuities) are formed. Accordingly, the body portion 910 does not conduct the internal electrode 801 to the external electrode 51 in a state where the exposed portion 921 is not formed.

The exposed portion 921 is formed at the break of the body portion 910 such that its both ends are connected to the body portion 910. Accordingly, the body portion 910 conducts the internal electrode 801 to the external electrode 51 in a state where the exposed portion 921 is formed (also, in a state where a physical cutting to be described later is not made in the exposed portion 921). The exposed portion 921 is formed to be exposed on the surface (the side surface) of the capacitor body 70. For example, the exposed portion 921 is formed on the surface (the side surface) of the capacitor body 70. In this case, the body portion 910 may be exposed on the surface of the capacitor body 70 at the connection portion with the exposed portion 921. Alternatively, the exposed portion 921 may be formed to be exposed on the surface (the side surface) of the capacitor body 70 at the edge of the inner layer of the capacitor body 70. In the example illustrated in FIG. 4A, two exposed portions 921 are formed. Specifically, one exposed portion 921 is formed on the rear side surface of the capacitor body 70, and the other exposed portion 921 is formed on the front side surface of the capacitor body 70. The two exposed portions 921 are preferably formed at positions point-symmetric with respect to the center C.

The conductor portion 92 is formed in the internal electrode layer 724-3. The conductor portion 92, as illustrated in FIG. 4B, includes a body portion 920, and an exposed portion 922. The conductor portion 92 is formed substantially in the similar manner as the conductor portion 91, and thus descriptions thereof will be omitted.

The conductor portion 95 is formed in the internal electrode layer 724-10. Similarly, the conductor portion 95, as illustrated in FIG. 4B, includes a body portion 950 and an exposed portion 925. The body portion 950 has one end connected to the internal electrode 821 and the other end connected to the external electrode 53. In the example illustrated in FIG. 4B, the body portion 950 is connected to the external electrode 53 through the conductor portion 531 (not illustrated in FIG. 4B). The body portion 950 extends to surround three sides of the internal electrode 821 in the left-right direction at the front side of the internal electrode 821, in the front-rear direction at the left side of the internal electrode 821, and in the left-right direction at the rear side of the internal electrode 821.

The body portion 950 may be formed while not exposed to the surface (the side surface) of the capacitor body 70. In the body portion 950, breaks (discontinuities) are formed. Accordingly, the body portion 950 does not conduct the internal electrode 821 to the external electrode 53 in a state where the exposed portion 925 is not formed. The exposed portion 925 is formed at the break of the body portion 950 such that its both ends are connected to the body portion 950. Accordingly, the body portion 950 conducts the internal electrode 821 to the external electrode 53 in a state where the exposed portion 925 is formed (also, in a state where a physical cutting to be described later is not made). The exposed portion 925 is formed to be exposed on the surface (the side surface) of the capacitor body 70. For example, the exposed portion 925 is formed on the surface (the side surface) of the capacitor body 70. In this case, the body portion 950 may be exposed on the surface of the capacitor body 70 at the connection portion with the exposed portion 925. Alternatively, the exposed portion 925 may be formed to be exposed on the surface (the side surface) of the capacitor body 70 at the edge of the inner layer of the capacitor body 70. In the example illustrated in FIG. 4B, two exposed portions 925 are formed. Specifically, one exposed portion 925 is formed on the front side surface of the capacitor body 70, and the other exposed portion 925 is formed on the rear side surface of the capacitor body 70. The two exposed portions 925 are preferably formed at positions point-symmetric with respect to the center C.

Similarly, in addition to the conductor portion 95, a similar conductor portion may be provided in another internal electrode (not illustrated) forming the second capacitor 304 (see, e.g., the exposed portions 926 to 928 in FIG. 2)

Next, referring to FIG. 5, descriptions will be made on a capacitance adjustment method of the crystal unit 100A.

Figure 5:
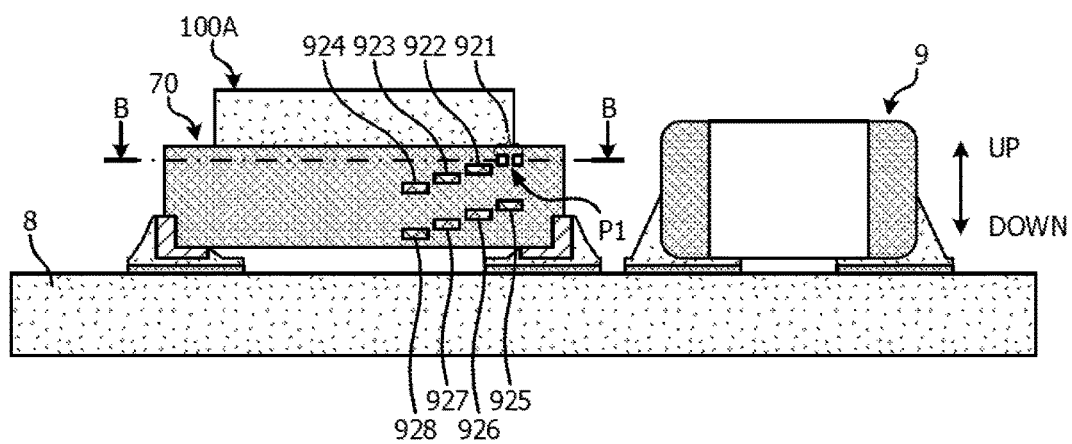
FIG. 5 is a view illustrating an example of a mounting state of a crystal unit 100A.

FIG. 5 is a view illustrating an example of a mounting state of the crystal unit 100A. The crystal unit 100A, as illustrated in FIG. 5, may be mounted on a board 8. In the example illustrated in FIG. 5, a peripheral component 9 is mounted in the vicinity of the crystal unit 100A.

In a state where the crystal unit 100A is mounted on the board 8 as illustrated in FIG. 5, a capacitance adjustment may be performed. The capacitance adjustment may be realized by applying a laser light to the exposed portions 921 to 928 of the crystal unit 100A, thereby cutting at least one of the exposed portions 921 to 928. Since the exposed portions 921 to 928 are formed to be exposed on the surface of the crystal unit 100A as described above, the laser light may be easily applied.

For example, a laser light may be applied to the exposed portion 921, thereby physically cutting the exposed portion 921 in the vertical direction so that the internal electrode 801 and the external electrode 51 may be disconnected from each other. In this case, since the internal electrode 801 does not function as a capacitor, by that amount, the capacitance of the first capacitor 302 may be reduced. Similarly, a laser light may be applied to the exposed portion 925, thereby physically cutting the exposed portion 925 in the vertical direction so that the internal electrode 821 and the external electrode 53 may be disconnected from each other. In this case, since the internal electrode 821 does not function as a capacitor, by that amount, the capacitance of the second capacitor 304 may be reduced.

In this manner, according to the first embodiment, only by physically cutting the exposed portions 921 to 928 in the vertical direction, the capacitance of the matching capacitor 300 of the crystal unit 100A may be reduced by a relatively large reduction amount (a reduction amount significantly larger than a physically cut range). This effect is advantageous when a capacitance to be adjusted (e.g., a capacitance to be reduced) is relatively large. Since the exposed portion 921 to 928 are formed at two places, that is, the front side surface and the rear side surface of the capacitor body 70, as described above, the workability of cutting by the laser light is improved. For example, when another component (e.g., the peripheral component 9) is arranged in proximity to the front side surface of the crystal unit 100A, the capacitance adjustment may be achieved without difficulty by physically cutting the exposed portions 921 to 928 at the rear side surface of the capacitor body 70.

Figure 6:
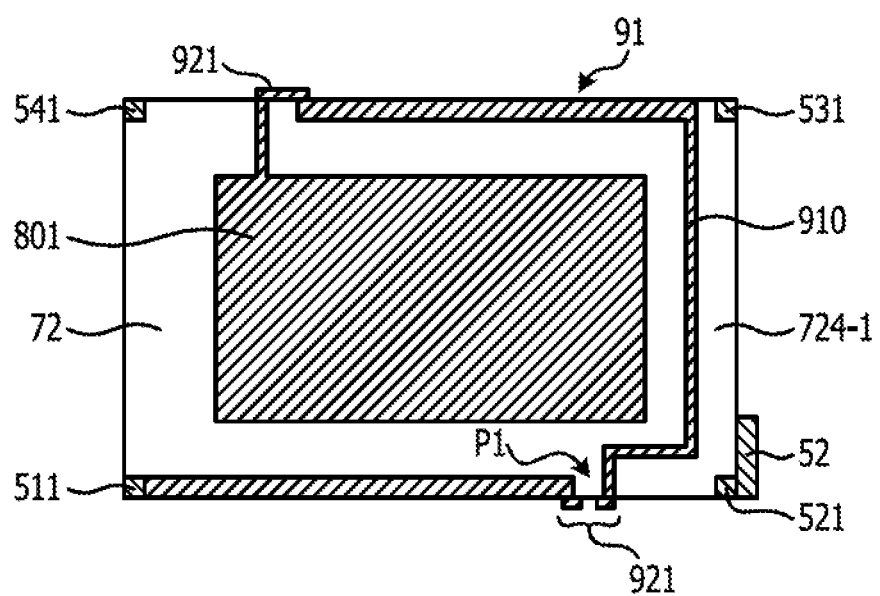
FIG. 6 is a sectional view taken along the line B-B illustrated in FIG. 5.

In FIG. 5, a state where the exposed portion 921 at the front side surface of the crystal unit 100A is physically cut (see, e.g., the arrow P1) by the laser light is schematically illustrated. FIG. 6 is a sectional view taken along the line B-B illustrated in FIG. 5.

When the exposed portion 921 of the front side surface of the crystal unit 100A is physically cut by the laser light, the connection state between the internal electrode 801 and the external electrode 51 through the conductor portion 91 is disconnected as illustrated in FIG. 6. That is, the internal electrode 801 is disconnected from the external electrode 51. In this case, as described above, since the internal electrode 801 does not function as a capacitor, by that amount, the capacitance of the first capacitor 302 is reduced.

As described above, according to the first embodiment, after the crystal unit 100A is mounted, the capacitance of the matching capacitor 300 may be largely reduced. Accordingly, even when an adjustment amount is relatively increased, an efficient adjustment may be achieved.

However, as described above, a vibration characteristic of the crystal unit 100A is generally varied under the influence of the capacitance of the pattern or the like on the board 8. Thus, even when the capacitance is adjusted at the time of manufacture of the crystal unit 100A as a single product, it is difficult to obtain a desired vibration characteristic of the crystal unit 100A after the crystal unit 100A is mounted.

In this respect, according to the first embodiment, as described above, the capacitance of the matching capacitor 300 may be largely reduced after the crystal unit 100A is mounted. Thus, it becomes easy to obtain a desired vibration characteristic of the crystal unit 100A after the crystal unit 100A is mounted. The vibration characteristic of the crystal unit 100A may be measured using a probe or the like. Accordingly, for example, a user may perform a capacitance adjustment as described above, while measuring the vibration characteristic of the crystal unit 100A using a probe or the like.

Further, according to the first embodiment, since the exposed portions 921 to 928, respectively, are formed at different side surfaces of the capacitor body 70 (e.g., the front side surface and the rear side surface in the first embodiment), the capacitance adjustment operation may be performed on either one of the side surfaces using the laser light. Accordingly, even when the peripheral component is present in proximity to the crystal unit 100A after the crystal unit 100A is mounted, the capacitance adjustment operation of the crystal unit 100A may be performed without difficulty.

In the first embodiment, internal electrodes in which the conductor portions 91 to 95 are provided are specific internal electrodes (e.g., such as the internal electrodes 801, 803 and 821), but internal electrodes in which conductor portions such as the conductor portions 91 to 95 are provided may be optional. Also, the number of internal electrodes in which the conductor portions such as the conductor portions 91 to 95 are provided may be optional. For example, any three of the conductor portions 91 to 94 may be omitted.

In the first embodiment described above, the conductor portions 91 to 95 are provided in the internal electrodes connected to the external electrode 51 or 53. Instead, similar conductor portions may be provided in internal electrodes connected to the external electrode 52 or 54.

In the first embodiment described above, the exposed portions 921 to 924 related to the first capacitor 302 are formed at different positions from each other in the left-right direction, but may be formed at the same positions. Further, the exposed portions 925 to 928 related to the second capacitor 304 may be formed at different positions from each other in the left-right direction, but may be formed at the same positions.

In the first embodiment described above, the conductor portion 91 has the two exposed portions 921, but may have only one exposed portion 921, or further include one or more similar exposed portions. This also applies to other conductor portions 92 to 95.

Second Embodiment

A crystal unit according to the second embodiment is different from the crystal unit 100A according to the first embodiment described above, in that the capacitor body 70 is replaced by a capacitor body 70B, and the conductor portions 91 and 92 are replaced by conductor portions 91B and 92B (e.g., another example of a first conductor portion or a second conductor portion). The capacitor body 70B is different from the capacitor body 70 according to the first embodiment described above, in that the internal electrodes 801 to 804 are replaced by internal electrodes 801B to 804B. In the descriptions of the second embodiment, the same components as those in the first embodiment described above are denoted by the same reference numerals.

Figure 7B:
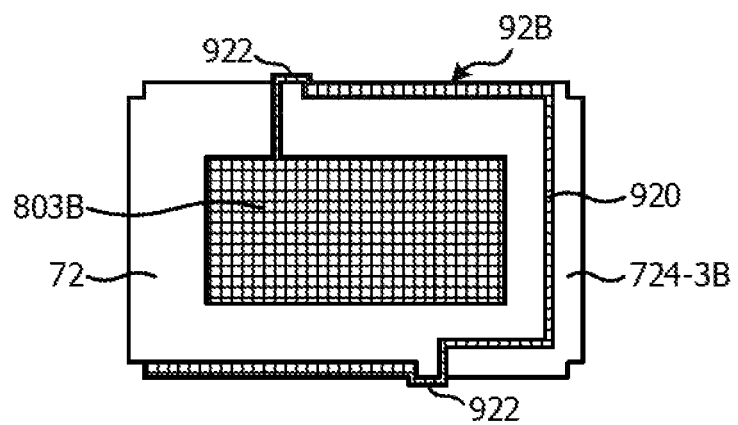
FIG. 7B is an explanatory view of a stacked structure of the capacitor body according to the second embodiment (Part 2)
Figure 7B:
Figure 7B:
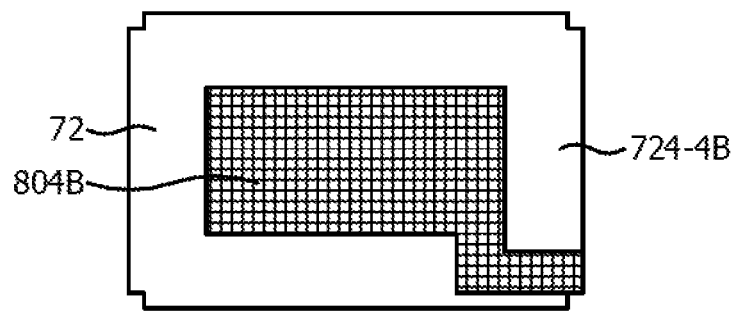

FIGS. 7A and 7B are explanatory views of a stacked structure of the capacitor body 70B according to the second embodiment, and illustrate top views of respective layers of the capacitor body 70B. In FIGS. 7A and 7B, only portions related to the conductor portions 91B and 92B are illustrated.

The capacitor body 70B forms a matching capacitor 300 (see, e.g., FIG. 1). The capacitor body 70B has a stacked structure including a dielectric 72 and internal electrodes (e.g., internal electrodes 801B to 804B, 821, and 822).

The internal electrodes 801B to 804B according to the second embodiment are substantially the same as the internal electrodes 801 to 804 according to the first embodiment described above, except that a size (area) is different. Specifically, the internal electrodes 801B to 804B have smaller areas than the internal electrodes 801 to 804. The internal electrodes 801B and 802B are substantially the same in area, and the internal electrodes 803B and 804B are substantially the same in area. The area of each of the internal electrodes 801B and 802B is smaller than the area of each of the internal electrodes 803B and 804B.

The conductor portions 91B and 92B according to the second embodiment are different from the conductor portions 91 and 92 according to the first embodiment described above in that a pattern (e.g., a pattern in the front-rear direction) for connection with each of the internal electrodes 801B and 803B is longer by a decreased amount of the area of each of the internal electrodes 801B and 803B.

The same effects as in the first embodiment as described above may be obtained by the second embodiment as well. Further, according to the second embodiment, an internal electrode with a desired area may be selected among internal electrodes having different areas (e.g., the internal electrodes 801B, 803B, etc.), and the selected internal electrode may be disconnected from the external electrode 51. Accordingly, the internal electrode according to the capacitance to be adjusted (e.g., reduced) may be disconnected from the external electrode 51. That is, in the second embodiment described above, since the internal electrodes 801B, 803B, and 805 (the internal electrode 805 is not illustrated) having at least three different areas are provided in relation to the first capacitor 302, the adjustments in various combinations may be made. In this regard, more internal electrodes having different areas, in which conductor portions such as the conductor portions 91B and 92B are provided, may be provided so as to further increase the degree of freedom of adjustment. Alternatively, for example, the area of the internal electrode 803B may be the same as the area of the internal electrode 805, so that only two areas of the internal electrodes may be employed.

In the second embodiment, only the internal electrodes related to the first capacitor 302 have been modified from those of the first embodiment described above, but the internal electrodes related to the second capacitor 304 may also be similarly modified.

Third Embodiment

The crystal unit according to the third embodiment is different from the crystal unit 100A according to the first embodiment described above, in that the capacitor body 70 is replaced by a capacitor body 70C, and the conductor portions 91 and 92 are replaced by conductor portions 91C and 92C (e.g., another example of a first conductor portion or a second conductor portion). The capacitor body 70C is different from the capacitor body 70 according to the first embodiment described above, in that the internal electrodes 801 and 803 are replaced by internal electrodes 801C and 803C. In the descriptions of the third embodiment, the same components as those in the first embodiment described above are denoted by the same reference numerals.

Figure 8A:
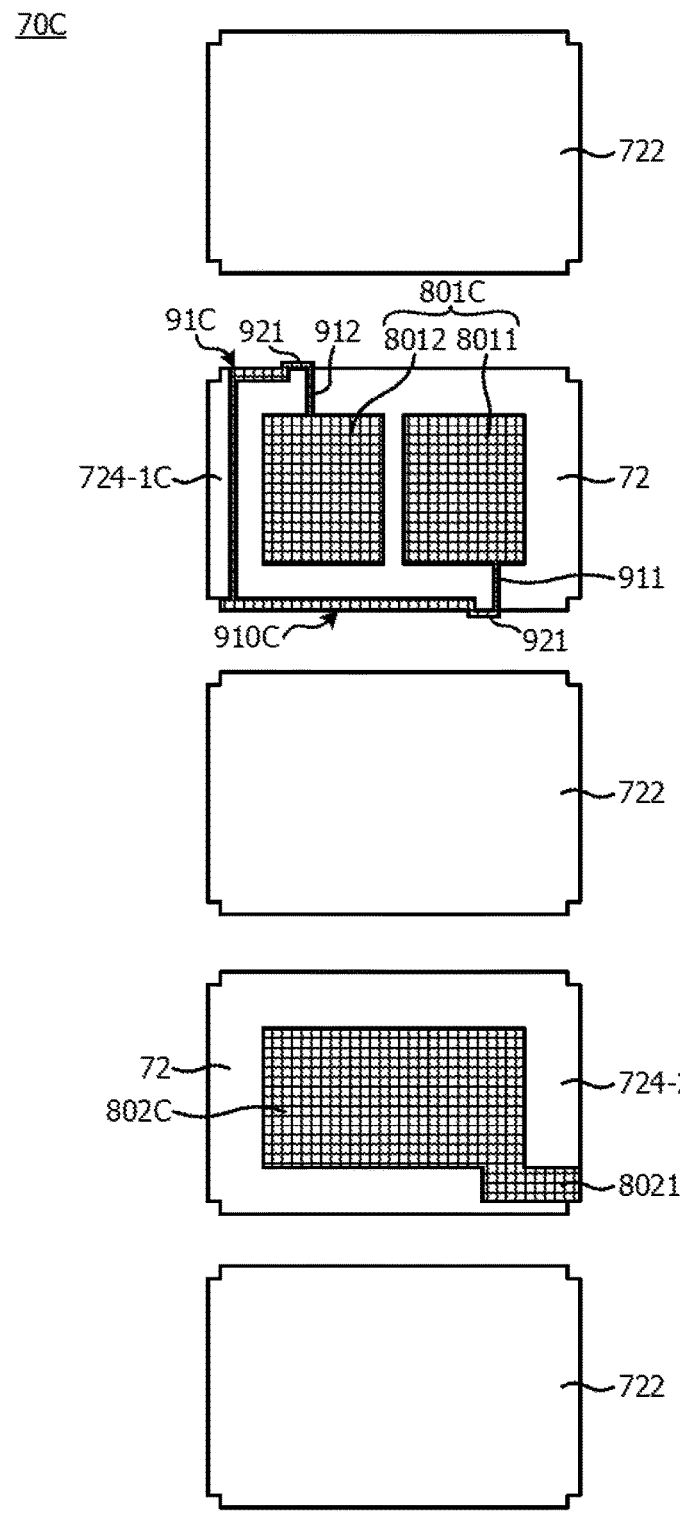
FIG. 8A is an explanatory view of a stacked structure of a capacitor body according to a third embodiment (Part 1)
Figure 8B:
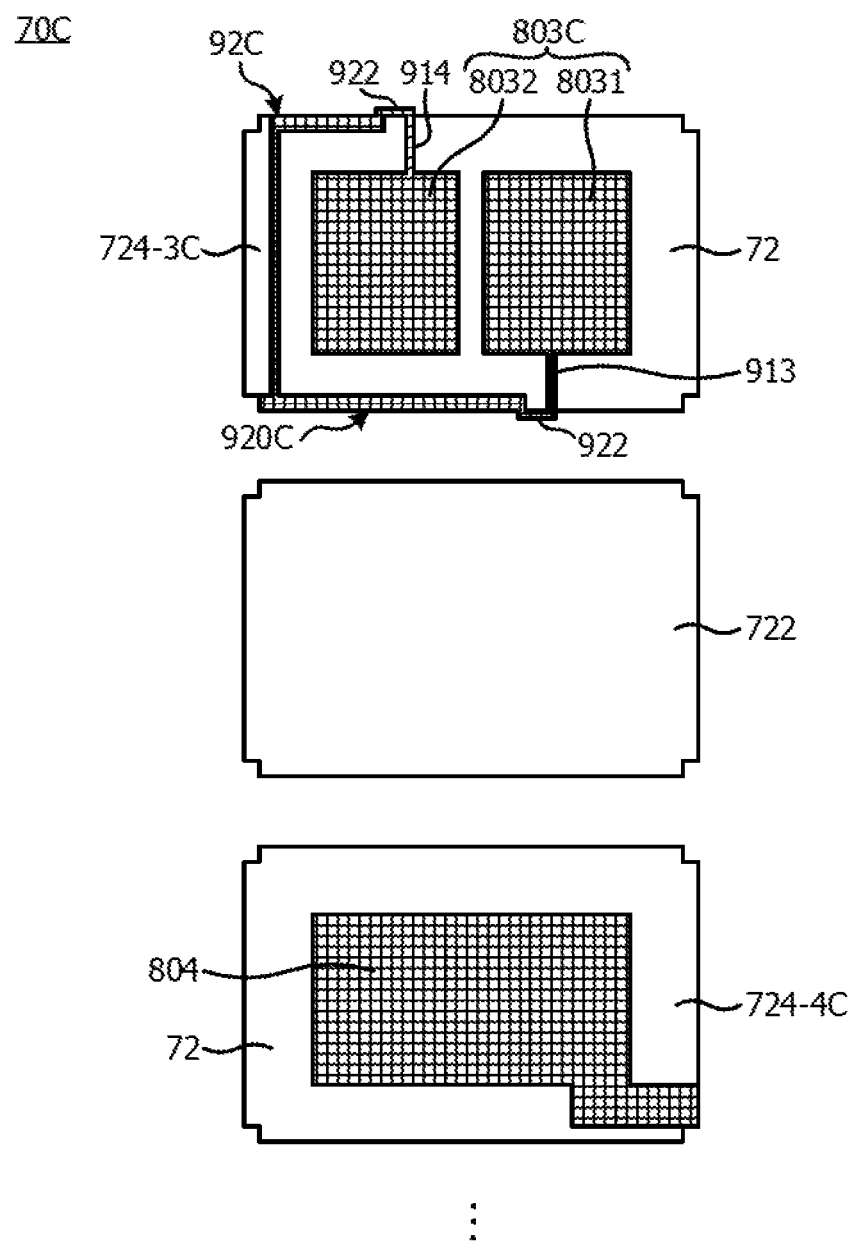
FIG. 8B is an explanatory view of a stacked structure of the capacitor body according to the third embodiment (Part 2)

FIGS. 8A and 8B are explanatory views of a stacked structure of the capacitor body 70C according to the third embodiment and illustrate top views of respective layers of the capacitor body 70C. In FIGS. 8A and 8B, only portions related to the conductor portions 91C and 92C are illustrated.

The capacitor body 70C forms a matching capacitor 300 (see, e.g., FIG. 1). The capacitor body 70C has a stacked structure including a dielectric 72 and internal electrodes (e.g., internal electrodes 801C, 802, 803C, 804, 821, and 822).

The internal electrodes 801C and 803C according to the third embodiment are substantially the same as the internal electrodes 801 and 803 according to the first embodiment described above, except that two divided portions are provided. Specifically, the internal electrode 801C includes a first divided portion 8011, and a second divided portion 8012. The first divided portion 8011 and the second divided portion 8012 are separated in the left-right direction. The first divided portion 8011 and the second divided portion 8012 are arranged to vertically face respective left and right halves of the internal electrode 802. In the example illustrated in FIG. 8A, the first divided portion 8011 and the second divided portion 8012 are formed to be aligned in the left-right direction, but may be arranged in other forms. Further, in the example illustrated in FIG. 8A, the first divided portion 8011 and the second divided portion 8012 have the same area, but may have different areas. Similarly, the internal electrode 803C includes a first divided portion 8031 and a second divided portion 8032. The first divided portion 8031 and the second divided portion 8032 are separated in the left-right direction. The first divided portion 8031 and the second divided portion 8032 are arranged to vertically face respective left and right halves of the internal electrode 804. In the example illustrated in FIG. 8B, the first divided portion 8031 and the second divided portion 8032 are formed to be aligned in the left-right direction, but may be arranged in other forms. Further, in the example illustrated in FIG. 8B, the first divided portion 8031 and the second divided portion 8032 have the same area, but may have different areas.

The conductor portions 91C and 92C according to the third embodiment are different from the conductor portions 91 and 92 according to the first embodiment described above in that the body portions 910 and 920 are replaced by the body portions 910C and 920C.

The body portion 910C has one end connected to the internal electrode 801C and the other end connected to the external electrode 51. One end of the body portion 910C (e.g., an end portion at the side connected to the internal electrode 801C) includes a first end portion 911 and a second end portion 912. The first end portion 911 is connected to the first divided portion 8011, and the second end portion 912 is connected to the second divided portion 8012. In the example illustrated in FIG. 8A, the body portion 910C includes a portion extending in the front-rear direction from the first end portion 911 toward the exposed portion 921 on the front side surface, and a portion extending in the left-right direction from the exposed portion 921 on the front side surface toward the left front end of an internal electrode layer 724-1C. Further, the body portion 910C includes a portion extending in the front-rear direction from the second end portion 912 toward the exposed portion 921 on the rear side surface, a portion extending in the left-right direction from the exposed portion 921 on the rear side surface toward the left rear end, and a portion extending in the front-rear direction from the left rear end toward the left front end. In the example illustrated in FIG. 8A, the first end portion 911 and the second end portion 912 are merged such that the body portion 910C is connected to the external electrode 51 via a conductor portion 511 (not illustrated in FIG. 8A). However, the body portion 910C may be connected to the external electrode 51 via the conductor portion 511 (not illustrated in FIG. 8A) through different paths from the first end portion 911 and the second end portion 912, respectively.

The body portion 920C has one end connected to the internal electrode 803C, and the other end connected to the external electrode 51. One end of the body portion 920C (e.g., an end portion at the side connected to the internal electrode 803C) includes a first end portion 913 and a second end portion 914. The first end portion 913 is connected to the first divided portion 8031, and the second end portion 914 is connected to the second divided portion 8032. In the example illustrated in FIG. 8B, the body portion 920C includes a portion extending in the front-rear direction from the first end portion 913 toward the exposed portion 922 on the front side surface, and a portion extending in the left-right direction from the exposed portion 922 on the front side surface toward the left front end of an internal electrode layer 724-3C. Further, the body portion 920C includes a portion extending in the front-rear direction from the second end portion 914 toward the exposed portion 922 on the rear side surface, a portion extending in the left-right direction from the exposed portion 922 on the rear side surface toward the left rear end, and a portion extending in the front-rear direction from the left rear end toward the left front end. In the example illustrated in FIG. 8B, the first end portion 913 and the second end portion 914 are emerged such that the body portion 920C is connected to the external electrode 51 via the conductor portion 511 (not illustrated in FIG. 8B). However, the body portion 920C may be connected to the external electrode 51 via the conductor portion 511 (not illustrated in FIG. 8B) through different paths from the first end portion 913 and the second end portion 914, respectively.

The same effects as in the first embodiment as described above may be obtained by the third embodiment as well. Further, according to the third embodiment, with respect to one internal electrode 801C, one or both of the first divided portion 8011 and the second divided portion 8012 may be selectively disconnected from the external electrode 51. Accordingly, a portion of the internal electrode according to the capacitance to be adjusted (e.g., reduced) may be disconnected from the external electrode 51. That is, in the third embodiment described above, various adjustments may be made according to the combinations of divided portions to be disconnected from the external electrode 51. In this regard, the number of divisions for one internal electrode (e.g. the internal electrode 801C), or the number of internal electrodes having the same configuration as the internal electrode 801C may be increased so as to further increase the degree of freedom of adjustment. Alternatively, for example, the internal electrode 803C may have the same configuration as the internal electrode 805, so that only the internal electrode 801C may be used as an internal electrode to be disconnected for capacitance reduction of the first capacitor 302.

In the third embodiment, only the internal electrodes related to the first capacitor 302 have been modified from those of the first embodiment described above, but the internal electrodes related to the second capacitor 304 may be similarly modified.

Fourth Embodiment

Figure 9:
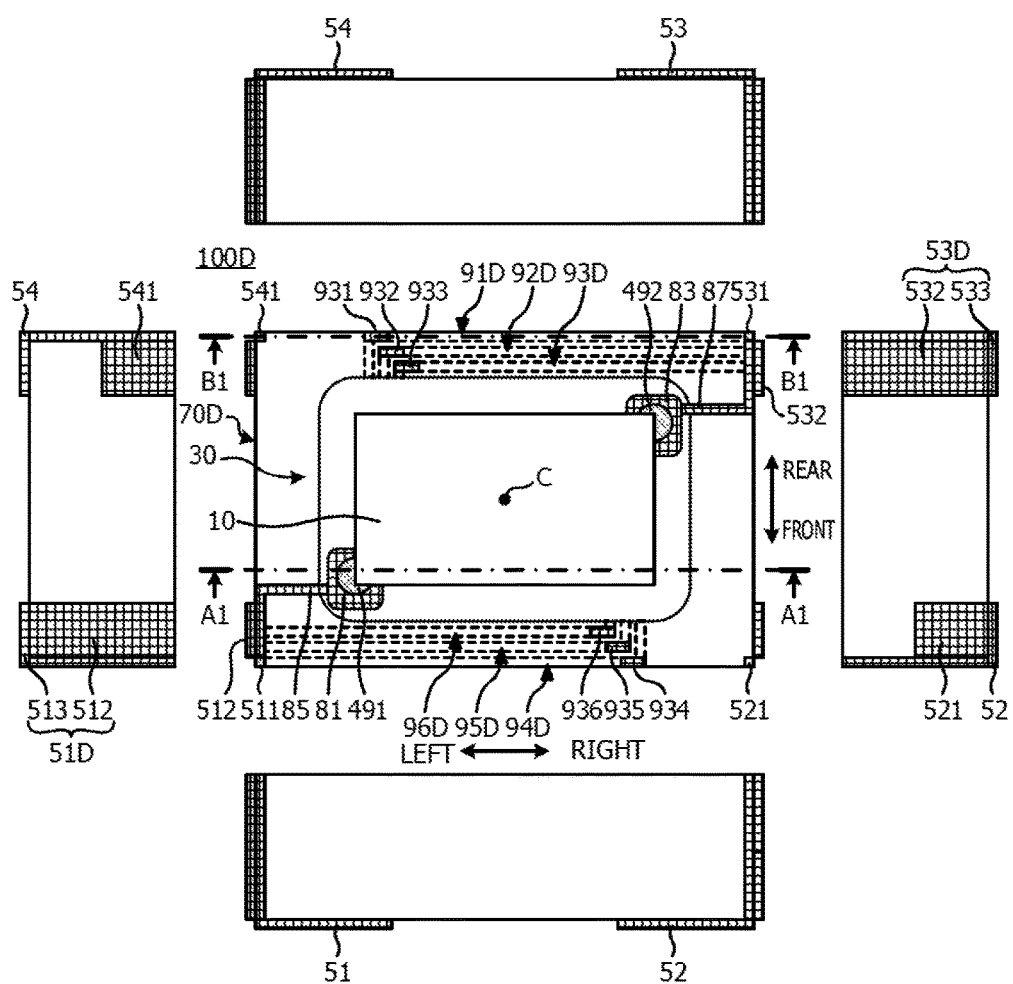
FIG. 9 is a 5-sided view of a crystal unit according to a fourth embodiment.
Figure 10A:
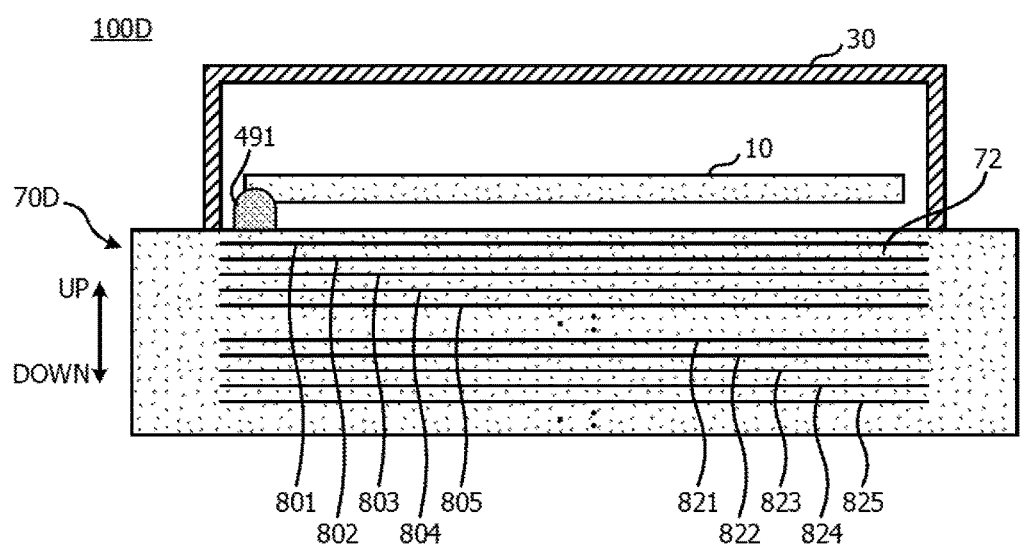
FIG. 10A is a sectional view taken along the line A1-A1 in FIG. 9.
Figure 10B:
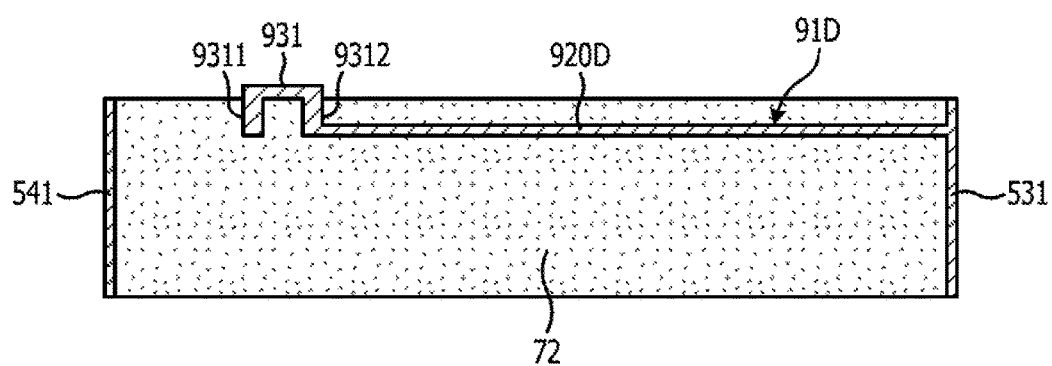
FIG. 10B is a sectional view taken along the line B1-B1 in FIG. 9.

FIG. 9 is a 5-sided view of a crystal unit 100D according to a fourth embodiment. In the top view of FIG. 9, the configuration (e.g., a crystal piece 10 or the like) within a casing 30 is illustrated in perspective view. FIG. 10A is a sectional view taken along the line A1-A1 in FIG. 9. FIG. 10B is a sectional view taken along the line B1-B1 in FIG. 9. In FIG. 10A, only a part of a plurality of internal electrodes is illustrated. Further, in FIG. 10B, unlike in FIG. 10A, the thickness of the body portion 920D or the like is schematically illustrated.

The crystal unit 100D is different from the crystal unit 100A according to the first embodiment described above, in that the capacitor body 70 is replaced by a capacitor body 70D, and the conductor portions 91 to 95 are replaced by conductor portions 91D to 96D (e.g., another example of a first conductor portion or a second conductor portion). The crystal unit 100D is different from the crystal unit 100A according to the first embodiment described above in that the external electrodes 51 and 53 are replaced by external electrodes 51D and 53D. Further, the crystal unit 100D is different from the crystal unit 100A according to the first embodiment described above in that the positions of conductor portions 521 and 541 connected to the external electrodes 52 and 54 are inverted upside down.

The external electrodes 51D and 53D form the first electrode 241 and the third electrode 243 illustrated in FIG. 1, respectively. The external electrode 51D includes a side electrode 512 formed on the left side surface of the capacitor body 70, and a bottom electrode 513 formed on the left front side of the bottom surface of the capacitor body 70. The external electrode 53D includes a side electrode 532 formed on the right side surface of the capacitor body 70, and a bottom electrode 533 formed on the right rear side of the bottom surface of the capacitor body 70.

The capacitor body 70D forms a matching capacitor 300 (see, e.g., FIG. 1). The capacitor body 70D has a stacked structure including a dielectric 72 and internal electrodes (e.g., internal electrodes 801 to 805 and 821 to 825). A part of the internal electrodes (the internal electrodes 801 to 805) is illustrated in FIGS. 11A and 11B to be described later.

The conductor portions 91D to 96D are formed in the inner layer and the surface of the capacitor body 70D. However, a part of the conductor portions 91D to 96D (e.g., exposed portions 931 to 936 to be described below (e.g., an example of a first or second exposed portion)) may be formed on the surface of the capacitor body 70D.

Figure 11B:
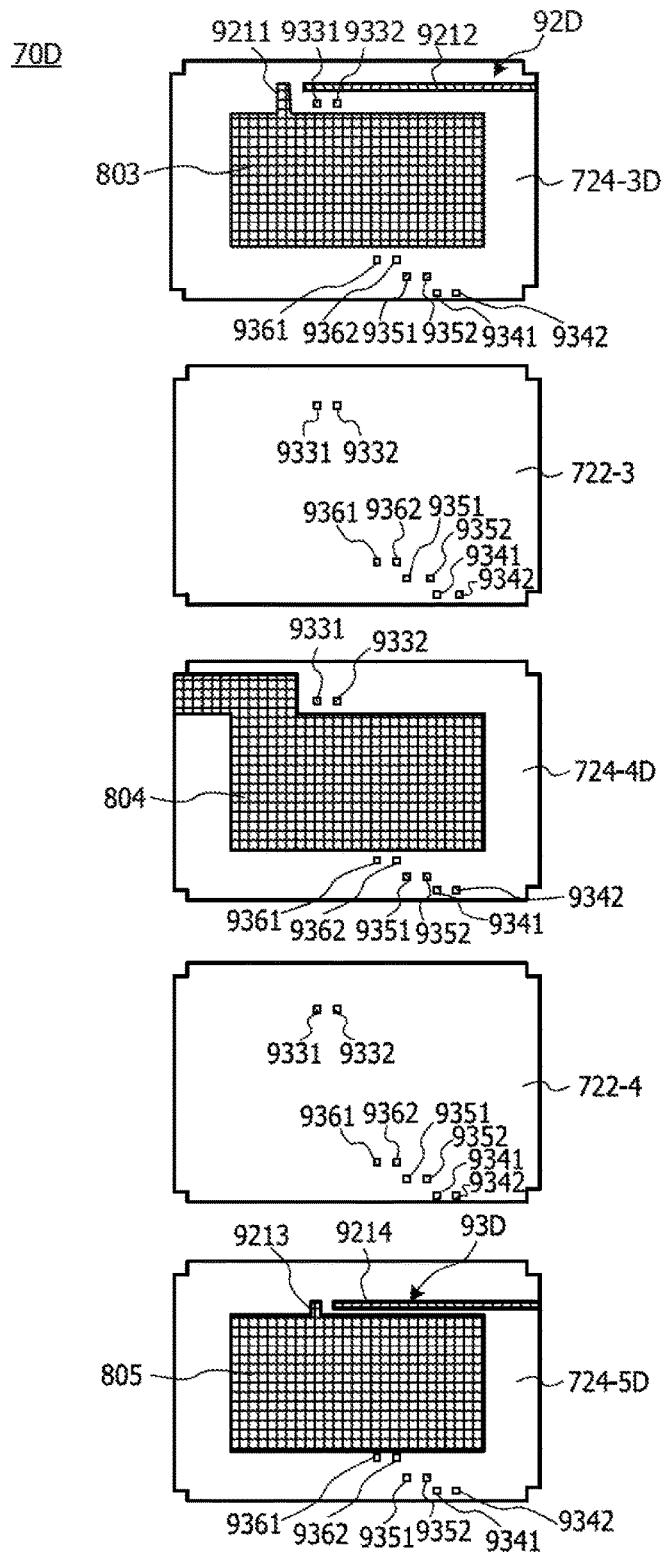
FIG. 11B is an explanatory view of a stacked structure of the capacitor body according to the fourth embodiment (Part 2)

FIGS. 11A and 11B are explanatory views of a stacked structure of the capacitor body 70D, and illustrate top views of respective layers of the capacitor body 70D. In FIGS. 11A and 11B, among the conductor portions 91D to 96D, only the conductor portions 91D to 93D are illustrated. The conductor portions 94D to 96D may be formed to be symmetrical with respect to the conductor portions 91D to 93D, respectively, around the point of center C in the top view.

The capacitor body 70D, as illustrated in FIGS. 11A and 11B, has a stacked structure in which a dielectric layer formed by the dielectric 72 and an internal electrode layer formed with the internal electrode are alternately stacked. The dielectric layers, as illustrated in FIGS. 11A and 11B, include dielectric layers 722-0 to 722-4. The internal electrode layers, as illustrated in FIGS. 11A and 11B, include internal electrode layers 724-1D to 724-5D.

The exposed portions 931 to 936 are formed on the dielectric layer 722-0 that forms the top surface of the capacitor body 70. For example, the exposed portions 931 to 936 are formed by printing a conductor pattern on the top surface of the dielectric layer 722-0. First via portions 9311 to 9361 and second via portions 9312 to 9362 are formed on the dielectric layers 722-0 and 722-1 to be connected to the exposed portions 931 to 936, respectively. The first via portions 9321 to 9361 and the second via portions 9322 to 9362 are formed on the dielectric layer 722-2 to be connected to the exposed portions 932 to 936, respectively. The first via portions 9331 to 9361 and the second via portions 9332 to 9362 are formed on the dielectric layers 722-3 and 722-4 to be connected to the exposed portions 933 to 936, respectively.

In the internal electrode layer 724-1D, the internal electrode 801 and the conductor portion 91D are formed, and in the internal electrode layer 724-2D, the internal electrode 802 is formed. The dielectric layer 722-1 is sandwiched between the internal electrode layers 724-1D and 724-2D. Further, the first via portions 9321 to 9361 and the second via portions 9322 to 9362 are formed in the internal electrode layers 724-1D and 724-2D. The internal electrode 802 is connected to the external electrode 54 via the conductor pattern 8021. For example, the internal electrode 801 and the conductor portion 91D may be formed by printing a conductor on the dielectric layer. Similarly, the internal electrode 802 and the conductor pattern 8021 may be formed by printing a conductor on the dielectric layer. In the same manner, the capacitor or the like in accordance with the internal electrodes 803 and 804 is formed.

The conductor portion 91D, as illustrated in FIG. 10B and FIG. 11A, includes a first body portion 9111, a second body portion 9112, the first via portion 9311, the second via portion 9312, and the exposed portion 931. The conductor portion 91D has one end connected to the internal electrode 801 and the other end connected to the external electrode 53D. In the example illustrated in FIG. 11A, one end of the first body portion 9111 is connected to the internal electrode 801, and one end of the second body portion 9112 is connected to the external electrode 53D. The other end of the first body portion 9111 and the other end of the second body portion 9112 are spaced apart. In the example illustrated in FIG. 11A, the other end of the first body portion 9111 and the other end of the second body portion 9112 are spaced apart in the left-right direction, but may be spaced apart in another direction. The first via portion 9311 is connected to the other end of the first body portion 9111, and the second via portion 9312 is connected to the other end of the second body portion 9112. The first via portion 9311 and the second via portion 9312 are spaced apart.

In the example illustrated in FIG. 11A, the first via portion 9311 and the second via portion 9312 are spaced apart in the left-right direction corresponding to the separating direction of the first body portion 9111 and the second body portion 9112, but may spaced apart in another direction. The first via portion 9311 extends through the inner layer of the capacitor body 70D in the vertical direction, and has a lower end connected to the first body portion 9111, and an upper end connected to the exposed portion 931. The second via portion 9312 extends through the inner layer of the capacitor body 70D in the vertical direction, and has a lower end connected to the second body portion 9112, and an upper end connected to the exposed portion 931. The position of the first via portion 9311 connected with the exposed portion 931, and the position of the second via portion 9312 connected with the exposed portion 931 are spaced apart.

In the example illustrated in FIG. 11A, the position of the first via portion 9311 connected with the exposed portion 931, and the position of the second via portion 9312 connected with the exposed portion 931 are spaced apart in the left-right direction corresponding to the separating direction of the first body portion 9111 and the second body portion 9112, but may be spaced apart in another direction. In this manner, the conductor portion 91D includes, along the path from the internal electrode 801 to the external electrode 53D, the first body portion 9111, the first via portion 9311, the exposed portion 931, the second via portion 9312, and the second body portion 9112. The first body portion 9111 and the second body portion 9112 do not conduct the internal electrode 801 to the external electrode 53D in a state where the exposed portion 931 is not formed. Meanwhile, the first body portion 9111 and the second body portion 9112 conduct the internal electrode 801 to the external electrode 53D in a state where the exposed portion 931 is formed (also, in a state where a physical cutting to be described later is not made).

The conductor portion 92D, as illustrated in FIG. 11B, includes a first body portion 9211, a second body portion 9212, the first via portion 9321, the second via portion 9322, and the exposed portion 932. The conductor portion 92D has one end connected to the internal electrode 803 and the other end connected to the external electrode 53D. In the example illustrated in FIG. 11B, one end of the first body portion 9211 is connected to the internal electrode 803, and one end of the second body portion 9212 is connected to the external electrode 53D. The other end of the first body portion 9211 and the other end of the second body portion 9212 are spaced apart.

In the example illustrated in FIG. 11B, the other end of the first body portion 9211 and the other end of the second body portion 9212 are spaced apart in the left-right direction, but may be spaced apart in another direction. The first via portion 9321 is connected to the other end of the first body portion 9211, and the second via portion 9322 is connected to the other end of the second body portion 9212. The first via portion 9321 and the second via portion 9322 are spaced apart.

In the example illustrated in FIG. 11B, the first via portion 9321 and the second via portion 9322 are spaced apart in the left-right direction corresponding to the separating direction of the first body portion 9211 and the second body portion 9212, but may be spaced apart in another direction. The first via portion 9321 extends through the inner layer of the capacitor body 70D in the vertical direction, and has a lower end connected to the first body portion 9211, and an upper end connected to the exposed portion 932. The second via portion 9322 extends through the inner layer of the capacitor body 70D in the vertical direction, and has a lower end connected to the second body portion 9212 and an upper end connected to the exposed portion 932. The position of the first via portion 9321 connected with the exposed portion 932, and the position of the second via portion 9322 connected with the exposed portion 932 are spaced apart.

In the example illustrated in FIG. 11B, the position of the first via portion 9321 connected with the exposed portion 932, and the position of the second via portion 9322 connected with the exposed portion 932 are spaced apart in the left-right direction corresponding to the separating direction of the first body portion 9211 and the second body portion 9212, but may be spaced apart in another direction. In this manner, the conductor portion 92D includes, along the path from the internal electrode 803 to the external electrode 53D, the first body portion 9211, the first via portion 9321, the exposed portion 932, the second via portion 9322, and the second body portion 9212. The first body portion 9211 and the second body portion 9212 do not conduct the internal electrode 803 to the external electrode 53D in a state where the exposed portion 932 is not formed. Meanwhile, the first body portion 9211 and the second body portion 9212 conduct the internal electrode 803 to the external electrode 53D in a state where the exposed portion 932 is formed (also, in a state where a physical cutting to be described later is not made).

The conductor portion 93D, as illustrated in FIG. 11B, includes a first body portion 9213, a second body portion 9214, the first via portion 9331, the second via portion 9332, and the exposed portion 933. The conductor portion 93D has one end connected to the internal electrode 805 and the other end connected to the external electrode 53D. In the example illustrated in FIG. 11B, one end of the first body portion 9213 is connected to the internal electrode 805, and one end of the second body portion 9214 is connected to the external electrode 53D. The other end of the first body portion 9213 and the other end of the second body portion 9214 are spaced apart.

In the example illustrated in FIG. 11B, the other end of the first body portion 9213 and the other end of the second body portion 9214 are spaced apart in the left-right direction, but may be spaced apart in another direction. The first via portion 9331 is connected to the other end of the first body portion 9213, and the second via portion 9332 is connected to the other end of the second body portion 9214. The first via portion 9331 and the second via portion 9332 are spaced apart. In the example illustrated in FIG. 11B, the first via portion 9331 and the second via portion 9332 are spaced apart in the left-right direction corresponding to the separating direction of the first body portion 9213 and the second body portion 9214, but may be spaced apart in another direction. The first via portion 9331 extends through the inner layer of the capacitor body 70D in the vertical direction, and has a lower end connected to the first body portion 9213 and an upper end connected to the exposed portion 933. The second via portion 9332 extends through the inner layer of the capacitor body 70D in the vertical direction, and has a lower end connected to the second body portion 9214 and an upper end connected to the exposed portion 933. The position of the first via portion 9331 connected with the exposed portion 933, and the position of the second via portion 9332 connected with the exposed portion 933 are spaced apart.

In the example illustrated in FIG. 11B, the position of the first via portion 9331 connected with the exposed portion 933, and the position of the second via portion 9332 connected with the exposed portion 933 are spaced apart in the left-right direction corresponding to the separating direction of the first body portion 9213 and the second body portion 9214, but may be spaced apart in another direction. In this manner, the conductor portion 93D includes, along the path from the internal electrode 805 to the external electrode 53D, the first body portion 9213, the first via portion 9331, the exposed portion 933, the second via portion 9332, and the second body portion 9214. The first body portion 9213 and the second body portion 9214 do not conduct the internal electrode 805 to the external electrode 53D in a state where the exposed portion 933 is not formed. Meanwhile, the first body portion 9213 and the second body portion 9214 conduct the internal electrode 805 to the external electrode 53D in a state where the exposed portion 933 is formed (also, in a state where a physical cutting to be described later is not made).

Figure 12:
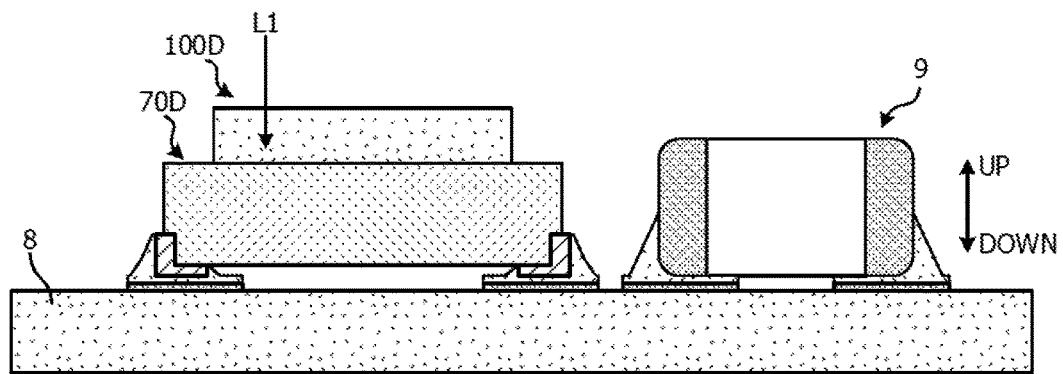
FIG. 12 is a view illustrating an example of a mounting state of the crystal unit.

FIG. 12 is a view illustrating an example of a mounting state of the crystal unit 100D. The crystal unit 100D, as illustrated in FIG. 12, may be mounted on the board 8. In the example illustrated in FIG. 12, the peripheral component 9 is mounted in the vicinity of the crystal unit 100D.

In a state where the crystal unit 100D is mounted on the board 8 as illustrated in FIG. 12, a capacitance adjustment may be performed. The capacitance adjustment may be realized by applying a laser light to the upper side of the crystal unit 100D, thereby cutting at least one of the exposed portions 931 to 936, as schematically indicated by the arrow L1 in FIG. 12. Since the exposed portions 931 to 936 are formed on the top surface of the capacitor body 70D (i.e., on the surface exposed to the outside, on which the casing 30 is not arranged) in the top view, as described above, the laser light may be easily applied.

For example, a laser light may be applied to the exposed portion 931, thereby physically cutting the exposed portion 931 in the front-rear direction so that the internal electrode 801 and the external electrode 53D may be disconnected from each other. In this case, since the internal electrode 801 does not function as a capacitor, by that amount, the capacitance of the second capacitor 304 may be reduced. Similarly, a laser light may be applied to the exposed portion 934, thereby physically cutting the exposed portion 934 in the front-rear direction so that the capacitance of the first capacitor 302 may be similarly reduced.

Figure 13:
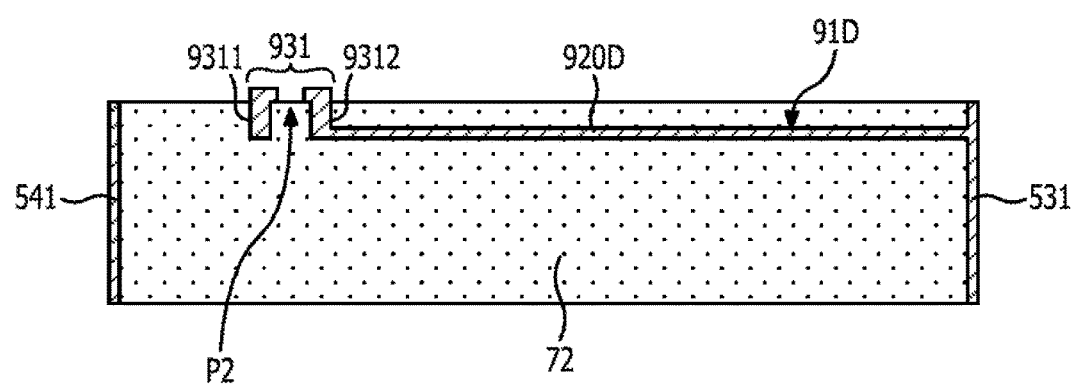
FIG. 13 is a sectional view illustrating a cut state of an exposed portion.

In FIG. 13, a state where the exposed portion 931 of the crystal unit 100D is physically cut (see, e.g., the arrow P2) by a laser light is schematically illustrated. FIG. 13 is a sectional view taken along the line B1-B1 illustrated in FIG. 9.

When the exposed portion 931 of the crystal unit 100D is physically cut by the laser light, the connection state between the internal electrode 801 and the external electrode 53D through the conductor portion 91D is disconnected as illustrated in FIG. 13. That is, the internal electrode 801 is disconnected from the external electrode 53D. In this case, as described above, since the internal electrode 801 does not function as a capacitor, by that much, the capacitance of the second capacitor 304 is reduced.

As described above, according to the fourth embodiment, as in the first embodiment described above, after the crystal unit 100D is mounted, the capacitance of the matching capacitor 300 may be largely reduced. Accordingly, even when an adjustment amount is relatively increased, an efficient adjustment may be achieved.

In the fourth embodiment, internal electrodes in which the conductor portions 91D to 96D are provided are specific internal electrodes (such as the internal electrodes 801 and 803), but internal electrodes in which conductor portions such as the conductor portions 91D to 96D are provided may be optional. Also, the number of internal electrodes in which the conductor portions such as the conductor portions 91D to 96D are provided is optional.

In the fourth embodiment described above, the conductor portions 91D to 96D are provided in the internal electrodes connected to the external electrode 51D or 53D. Instead, similar conductor portions may be provided in internal electrodes connected to the external electrode 52 or 54.

In the fourth embodiment described above, the conductor portion 91D has one exposed portion 931, but may have two or more exposed portions 931. This also applies to other conductor portions 92D to 96D.

Fifth Embodiment

The crystal unit according to the fifth embodiment is different from the crystal unit 100D according to the fourth embodiment described above in that the capacitor body 70D is replaced by a capacitor body 70E. Further, the crystal unit according to the fifth embodiment is different from the crystal unit 100D according to the fourth embodiment described above, in that the conductor portions 91D, 92D, 94D, and 95D are replaced by conductor portions 91E, 92E, 94E, and 95E (another example of a first conductor portion or a second conductor portion). The capacitor body 70E is different from the capacitor body 70D according to the fourth embodiment described above, in that the internal electrodes 801 to 804 and 821 to 824 are replaced by internal electrodes 801E to 804E and 821E to 824E. In the descriptions of the fifth embodiment, the same components as those in the fourth embodiment described above are denoted by the same reference numerals.

Figure 14A:
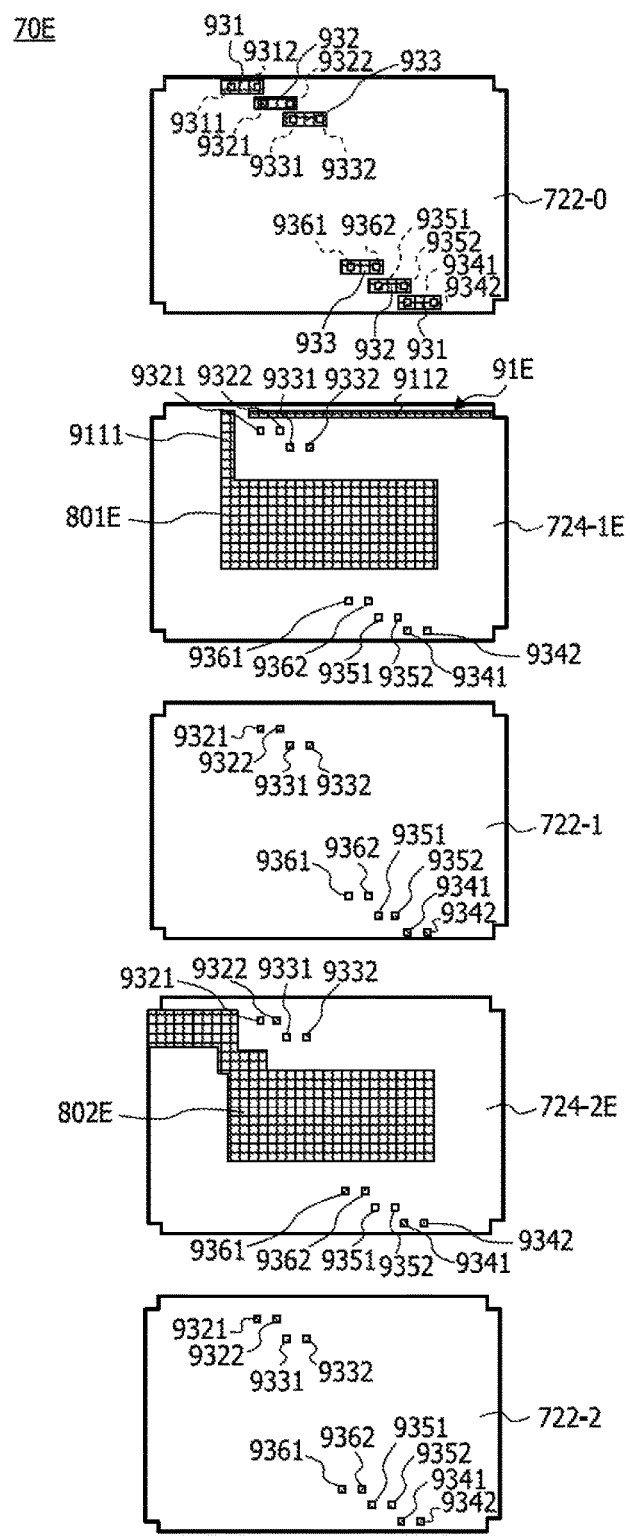
FIG. 14A is an explanatory view of a stacked structure of a capacitor body according to a fifth embodiment (Part 1)
Figure 14B:
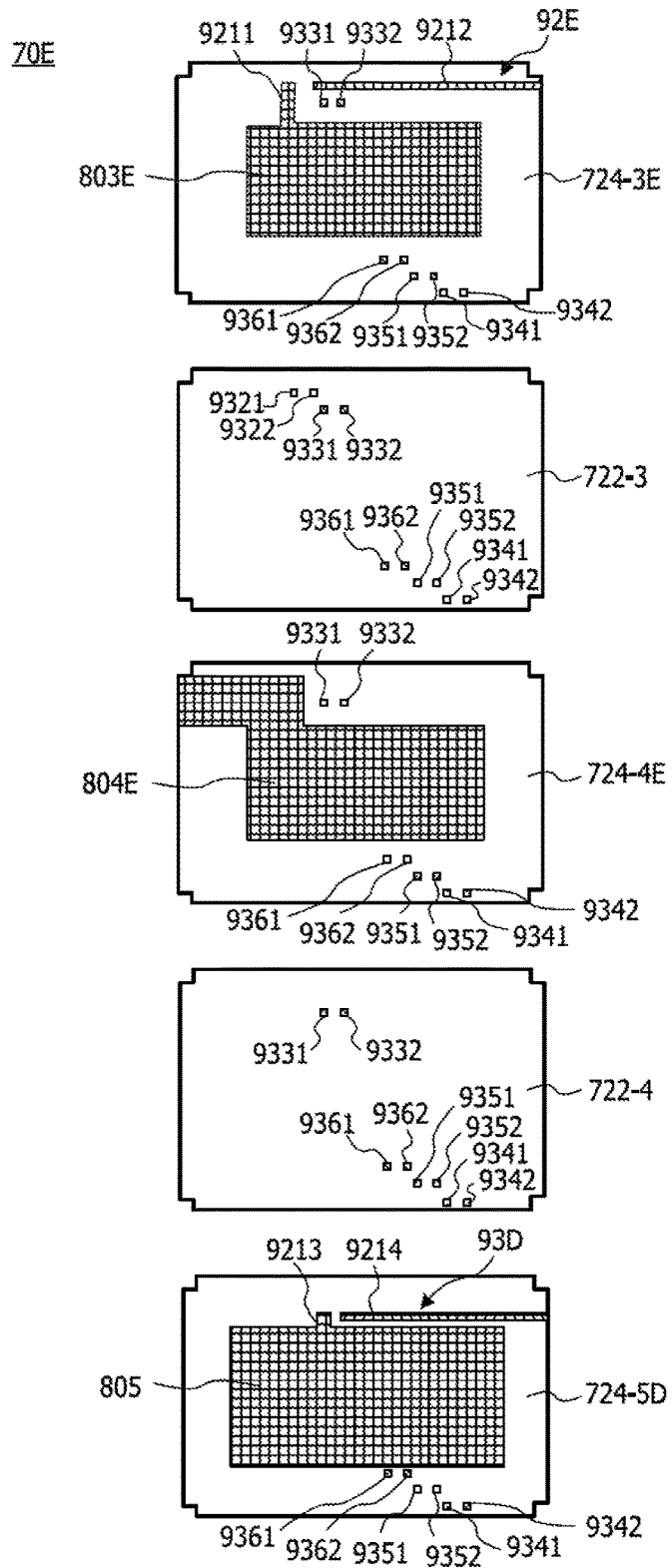
FIG. 14B is an explanatory view of a stacked structure of the capacitor body according to the fifth embodiment (Part 2).

FIGS. 14A and 14B are explanatory views of a stacked structure of the capacitor body 70E according to the fifth embodiment, and illustrate top views of respective layers of the capacitor body 70E. In FIGS. 14A and 14B, among the conductor portions 91E to 96D, only the conductor portions 91E, 92E, and 93D are illustrated. The conductor portions 94E, 95E, and 96D may be formed to be symmetrical with respect to the conductor portions 91E, 92E, and 93D, respectively, around the point of center C in the top view. Further, in FIGS. 14A and 14B, only the internal electrodes 801E to 804E are illustrated. The internal electrodes 821E to 824E may be formed to be symmetrical with respect to the internal electrodes 801E to 804E, respectively, around the point of center C in the top view.

The internal electrodes 801E to 804E according to the fifth embodiment are substantially the same as the internal electrodes 801 to 804 according to the fourth embodiment described above, except that a size (area) is different. Specifically, the internal electrodes 801E to 804E have smaller areas than the internal electrodes 801 to 804. The internal electrodes 801E and 802E are substantially the same in area, and the internal electrodes 803E and 804E are substantially the same in area. The area of each of the internal electrodes 801E and 802E is smaller than the area of each of the internal electrodes 803E and 804E.

The conductor portions 91E and 92E according to the fifth embodiment are different from the conductor portions 91D and 92D according to the fourth embodiment described above, in that a pattern (e.g., the first body portion 9111, 9211) for connection with each of the internal electrodes 801E and 803E is longer by a decreased amount of the area of each of the internal electrodes 801E and 803E.

By the fifth embodiment as well, the same effects as in the second embodiment described above may be obtained. That is, according to the fifth embodiment, an internal electrode with a desired area may be selected among internal electrodes having different areas (e.g., the internal electrodes 801E, 803E, etc.) and the selected internal electrode may be disconnected from the external electrode 53D. Accordingly, the internal electrode according to the capacitance to be adjusted (e.g., reduced) may be disconnected from the external electrode 53D. That is, in the fifth embodiment described above, since the internal electrodes 801E, 803E, and 805 having at least three different areas are provided in relation to the second capacitor 304, the adjustments in various combinations may be made. In this respect, more internal electrodes having different areas, in which conductor portions such as the conductor portions 91E, 92E, and 93D are provided, may be provided so as to further increase the degree of freedom of adjustment. Alternatively, for example, the area of the internal electrode 803E may be the same as the area of the internal electrode 805 so that only two areas of the internal electrodes may be employed.

In the fifth embodiment, only the internal electrodes related to the second capacitor 304 have been modified from those of the fourth embodiment described above, but the internal electrodes related to the first capacitor 302 may be similarly modified.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A crystal unit comprising:
    a capacitor in which a plurality of dielectrics and a plurality of internal electrodes are alternately stacked;
    a crystal piece arranged above the capacitor and having excitation electrodes on both surfaces thereof;
    an external electrode formed on a surface of the capacitor; and
    a first conductor portion formed within the capacitor, and including
        one end electrically coupled to a first internal electrode among the plurality of internal electrodes,
        the other end electrically coupled to the external electrode, and
        a first exposed portion formed to protrude from the surface of the capacitor between the one end and the other end.

2. The crystal unit according to claim 1, wherein a cut portion is formed in the first exposed portion to electrically disconnect the one end and the other end from each other.

3. The crystal unit according to claim 1, wherein the first exposed portion is formed on a first side surface in a stacking direction of the capacitor, and the first conductor portion further includes:
    a first body portion formed in an inner layer of the capacitor and forming the one end;
    a second body portion formed in the inner layer of the capacitor away from the first body portion and forming the other end;

a first connecting portion extending in the stacking direction of the capacitor, electrically coupled to one part of the first exposed portion on the first side surface, and electrically coupled to the first body portion; and a second connecting portion extending in the stacking direction of the capacitor, electrically coupled to another part of the first exposed portion on the first side surface, and electrically coupled to the second body portion.

4. The crystal unit according to claim 1, further comprising:

a second conductor portion formed in the capacitor, and including
one end electrically coupled to a second internal electrode among the plurality of internal electrodes,
the other end electrically coupled to the external electrode, and
a second exposed portion exposed on the surface of the capacitor between the one end and the other end.

5. The crystal unit according to claim 4, wherein a cut portion is formed in at least one of the first exposed portion and the second exposed portion to electrically disconnect the one end and the other end from each other.

6. The crystal unit according to claim 4, wherein the first internal electrode and the second internal electrode are different in area.

7. The crystal unit according to claim 4, wherein each of the first exposed portion and the second exposed portion is formed on a first side surface in a stacking direction of the capacitor, and each of the first conductor portion and the second conductor portion further includes:

a first body portion formed in an inner layer of the capacitor, and forming the one end;

a second body portion formed in the inner layer of the capacitor away from the first body portion and forming the other end;

a first connecting portion formed in the inner layer of the capacitor, extending in the stacking direction of the capacitor, electrically coupled to one part of the first exposed portion on the first side surface, and electrically coupled to the first body portion; and a second connecting portion formed in the inner layer of the capacitor, extending in the stacking direction of the capacitor, electrically coupled to another part of the first exposed portion on the first side surface, and electrically coupled to the second body portion.

8. The crystal unit according to claim 4, wherein the first exposed portion and the second exposed portion are offset in a direction perpendicular to the stacking direction of the capacitor.

9. The crystal unit according to claim 1, wherein the first exposed portion is formed on each of a first portion on the surface of the capacitor, and a second portion different from the first portion on the surface of the capacitor.

10. The crystal unit according to claim 9, wherein the first exposed portion is formed on each of a first side surface of the capacitor and a second side surface of the capacitor opposite to the first side surface when a direction perpendicular to a stacking direction of the capacitor is considered as a lateral direction.

11. The crystal unit according to claim 9, wherein the first internal electrode includes a first divided portion and a second divided portion, the one end of the first conductor portion includes a first end portion electrically coupled to the first divided portion, and a second end portion electrically coupled to the second divided portion, the first exposed portion formed on the first portion is formed between the first end portion and the other end in the first conductor portion, and the first exposed portion formed on the second portion is formed between the second end portion and the other end in the first conductor portion.

12. The crystal unit according to claim 10, wherein the first exposed portion formed on the first side surface and the first exposed portion formed on the second side surface are located point-symmetrically around a center of the capacitor when viewed in the stacking direction of the capacitor.

13. A method of adjusting a crystal unit including a crystal piece, a capacitor having a stacked structure of a dielectric and a plurality of internal electrodes; and an external electrode formed on a surface of the capacitor; an excitation electrode formed on the crystal piece and electrically coupled to ground through the capacitor, the method comprising:

forming a first conductor portion including one end electrically coupled to a first internal electrode among the plurality of internal electrodes, the other end electrically coupled to the external electrode, and a first exposed portion formed to protrude from the surface of the capacitor, between the one end and the other end, in the capacitor; and irradiating a laser light to the first conductor portion to physically cut the first conductor portion after the crystal unit is mounted.

14. The crystal unit according to claim 11, wherein the first divided portion and the second divided portion are arranged to vertically face respective left and right halves of the first internal electrode.

15. The crystal unit according to claim 11, wherein the first divided portion and the second divided portion have different areas.

16. The crystal unit according to claim 1, wherein the first exposed portion is formed on an upper surface of the capacitor, and the first conductor portion further includes:

a first body portion formed in an inner layer of the capacitor and forming the one end;

a second body portion formed in the inner layer of the capacitor away from the first body portion and forming the other end;

a first via portion extending in a direction perpendicular to a stacking direction of the capacitor, electrically coupled to one part of the first exposed portion on the upper surface of the capacitor, and electrically coupled to the first body portion; and a second via portion extending in the direction perpendicular to the stacking direction of the capacitor, electrically coupled to another part of the first exposed portion on the upper surface of the capacitor, and electrically coupled to the second body portion.

* * * * *